United States Patent
Evans et al.

(10) Patent No.: US 10,146,893 B1
(45) Date of Patent: Dec. 4, 2018

(54) SYSTEMS AND METHODS FOR EVALUATING ELECTRONIC CONTROL UNITS WITHIN VEHICLE EMULATIONS

(71) Applicant: Symantec Corporation, Mountain View, CA (US)

(72) Inventors: Nathan Evans, Sterling, VA (US); Azzedine Benameur, Fairfaix Station, VA (US); Yun Shen, Dublin (IE)

(73) Assignee: Symantec Corporation, Mountain View, CA (US)

( * ) Notice: Subject to any disclaimer, the term of this patent is extended or adjusted under 35 U.S.C. 154(b) by 608 days.

(21) Appl. No.: 14/671,036

(22) Filed: Mar. 27, 2015

(51) Int. Cl.
*G06F 17/50* (2006.01)

(52) U.S. Cl.
CPC .................. *G06F 17/5009* (2013.01)

(58) Field of Classification Search
CPC .................................................. G06F 17/5009
USPC .......................................................... 703/7–8
See application file for complete search history.

(56) References Cited

U.S. PATENT DOCUMENTS

| | | | |
|---|---|---|---|
| 7,015,811 B2 | 3/2006 | Decker et al. | |
| 7,257,522 B2 * | 8/2007 | Hagiwara | G01M 13/02 |
| | | | 477/110 |
| 7,475,124 B2 | 1/2009 | Jiang et al. | |
| 7,673,074 B1 | 3/2010 | Sebastian et al. | |
| 7,861,300 B2 | 12/2010 | Arnold et al. | |
| 8,104,090 B1 | 1/2012 | Pavlyushchik | |
| 8,126,891 B2 | 2/2012 | Laxman et al. | |
| 8,341,745 B1 | 12/2012 | Chau et al. | |
| 8,544,087 B1 | 9/2013 | Eskin et al. | |
| 8,566,938 B1 | 10/2013 | Prakash et al. | |
| 8,925,037 B2 | 12/2014 | Marino et al. | |
| 8,973,133 B1 | 3/2015 | Cooley | |
| 9,053,516 B2 | 6/2015 | Stempora | |

(Continued)

FOREIGN PATENT DOCUMENTS

| | | |
|---|---|---|
| CN | 102571469 A | 7/2012 |
| CN | 102893289 A | 1/2013 |
| EP | 2515250 A1 | 10/2012 |

OTHER PUBLICATIONS

Bajpai, et al; Systems and Methods for Detecting Suspicious Microcontroller Messages; U.S. Appl. No. 15/143,284, filed Apr. 29, 2016.

(Continued)

*Primary Examiner* — Eunhee Kim
(74) *Attorney, Agent, or Firm* — Fisher Broyles, LLP

(57) ABSTRACT

A computer-implemented method for evaluating electronic control units within vehicle emulations may include (1) connecting an actual electronic control unit for a vehicle to a vehicle bus that emulates network traffic rather than actual network traffic generated by operation of the vehicle, (2) manipulating input to the actual electronic control unit to test how safely the actual electronic control unit and the emulated electronic control unit respond to the manipulated input, (3) detecting an output from the actual electronic control unit that indicates a response, from the actual electronic control unit, to manipulating the input, and (4) evaluating a safety level of at least one of the actual electronic control unit and the emulated electronic control unit based on detecting the output from the actual electronic control unit. Various other methods, systems, and computer-readable media are also disclosed.

19 Claims, 7 Drawing Sheets

(56) References Cited

U.S. PATENT DOCUMENTS

| | | | |
|---|---|---|---|
| 9,088,560 | B1 | 7/2015 | Newstadt et al. |
| 9,141,790 | B2 | 9/2015 | Roundy et al. |
| 9,148,441 | B1 | 9/2015 | Tamersoy et al. |
| 9,166,997 | B1 | 10/2015 | Guo et al. |
| 9,256,739 | B1 | 2/2016 | Roundy et al. |
| 9,332,030 | B1 | 5/2016 | Pereira |
| 9,384,066 | B1 | 7/2016 | Leita et al. |
| 9,473,380 | B1 | 10/2016 | Bermudez et al. |
| 9,529,990 | B2 | 12/2016 | Newstadt et al. |
| 9,582,669 | B1 | 2/2017 | Shen et al. |
| 2002/0124089 | A1 | 9/2002 | Aiken et al. |
| 2004/0044771 | A1 | 3/2004 | Allred et al. |
| 2004/0059822 | A1 | 3/2004 | Jiang et al. |
| 2005/0030969 | A1 | 2/2005 | Fredriksson |
| 2005/0138413 | A1 | 6/2005 | Lippmann et al. |
| 2006/0095573 | A1 | 5/2006 | Carle et al. |
| 2008/0088408 | A1 | 4/2008 | Backman |
| 2008/0134327 | A1 | 6/2008 | Bharrat et al. |
| 2009/0144308 | A1 | 6/2009 | Huie et al. |
| 2009/0157365 | A1* | 6/2009 | Higuchi ............... G05B 17/02 703/8 |
| 2010/0186088 | A1 | 7/2010 | Banerjee et al. |
| 2010/0192226 | A1 | 7/2010 | Noel et al. |
| 2010/0235879 | A1 | 9/2010 | Burnside et al. |
| 2011/0019774 | A1 | 1/2011 | Furuta |
| 2011/0047620 | A1 | 2/2011 | Mahaffey et al. |
| 2011/0083180 | A1 | 4/2011 | Mashevsky et al. |
| 2011/0302656 | A1 | 12/2011 | El-Moussa |
| 2011/0314546 | A1 | 12/2011 | Aziz et al. |
| 2011/0320617 | A1 | 12/2011 | Annamalaisami et al. |
| 2012/0144468 | A1 | 6/2012 | Pratt et al. |
| 2012/0233683 | A1 | 9/2012 | Ibrahim et al. |
| 2013/0042294 | A1 | 2/2013 | Colvin et al. |
| 2013/0212659 | A1 | 8/2013 | Maher et al. |
| 2013/0333032 | A1 | 12/2013 | Delatorre et al. |
| 2014/0226664 | A1 | 8/2014 | Chen et al. |
| 2014/0258379 | A1 | 9/2014 | L'Heureux et al. |
| 2014/0330977 | A1 | 11/2014 | van Bemmel |
| 2014/0365646 | A1 | 12/2014 | Xiong |
| 2015/0113638 | A1 | 4/2015 | Valasek et al. |
| 2015/0150124 | A1 | 5/2015 | Zhang et al. |
| 2015/0261655 | A1 | 9/2015 | Versteeg et al. |
| 2015/0281047 | A1 | 10/2015 | Raju et al. |
| 2017/0118234 | A1 | 4/2017 | Arora et al. |

OTHER PUBLICATIONS

Michael Pukish, et al; Systems and Methods for Detecting Transactional Message Sequences That are Obscured in Multicast Communications; U.S. Appl. No. 15/194,337, filed Jun. 27, 2016.

Steven Noel et al., "Correlating Intrusion Events and Building Attack Scenarios Through Attack Graph Distances", Computer Security Applications Conference, 2004. 20$^{th}$ Annual Tucson, AZ, USA Dec. 6-10, 2004, (Dec. 10, 2004), pp. 350-359.

"Volvo tests Cloud-based V2V ice warning concept", http://telematicsnews.info/2014/03/19/volvo-tests-cloud-based-v2v-ice-warning-sharing_m5202/, as accessed Aug. 29, 2014, Telematics News, (Mar. 19, 2014).

"EMI/ESD Protection Solutions for the CAN Bus", http://www.onsemi.com/pub_link/Collateral/AND8169-D.PDF, as accessed Aug. 29, 2014, Publication Order No. AND8169/D, ON Semiconductor, Semiconductor Components Industries, LLC, (Jun. 2014—Rev. 2).

Lepkowski, J. et al., "EMI/ESD protection solutions for the CAN bus", http://www.can-cia.org/fileadmin/cia/files/icc/10/cia_paper_lepkowski.pdf, as accessed Aug. 29, 2014, iCC 2005, CAN in Automation, (2005).

Wolf, Marko et al., "Security in Automotive Bus Systems", http://www.weika.eu/papers/WolfEtAl_SecureBus.pdf, as accessed Aug. 29, 2014, (2004).

Kleberger, Pierre et al., "Security Aspects of the In-Vehicle Network in the Connected Car", Intelligent Vehicles Symposium (IV), 2011 IEEE, Baden-Baden, Germany, (Jun. 5-9, 2011), pp. 528-533.

Ben Othmane, Lotfi et al., "Towards Extended Safety in Connected Vehicles", Proceedings of the 16th International IEEE Annual Conference on Intelligent Transportation Systems (ITSC 2013), The Hague, The Netherlands, (Oct. 6-9, 2013).

Muter, M. et al., "A structured approach to anomaly detection for in-vehicle networks", 2010 Sixth International Conference on Information Assurance and Security (IAS), Atlanta, GA, (Aug. 23-25, 2010), pp. 92-98.

Muter, M. et al., "Entropy-based anomaly detection for in-vehicle networks", 2011 IEEE Intelligent Vehicles Symposium (IV), DOI: 10.1109/IVS.2011.5940552, Baden-Baden, Germany, (Jun. 5-9, 2011), pp. 1110-1115.

"Driver Feedback™", https://play.google.com/store/apps/details?id=com.statefarm.driverfeedback, as accessed Aug. 29, 2014, State Farm Insurance, Android Apps on Google Play, (Jun. 2, 2013).

"Controller Area Network (CAN) Overview", http://www.ni.com/white-paper/2732/en/, as accessed Aug. 29, 2014, National Instruments Corporation, (Aug. 1, 2014).

"CAN protocol specification", http://www.can-cia.org/index.php?id=164, as accessed Aug. 29, 2014, (Oct. 17, 2010).

"FlexRay Automotive Communication Bus Overview", http://www.ni.com/white-paper/3352/en/, as accessed Aug. 29, 2014, National Instruments Corporation, (Aug. 21, 2009).

"Snapshot®", https://www.progressive.com/auto/snapshot/, as accessed Aug. 29, 2014, Progressive Casualty Insurance Company, (Mar. 8, 2013).

"Bourns® Type 6002 Non-contacting Steering Angle Sensor", http://www.we-conect.com/cms/media/uploads/events/415/dokumente/Bourns_-_Non-Contacting_Steering_Angle_Sensor_Type_6002.pdf, as accessed Aug. 29, 2014, (on or before Aug. 29, 2014).

Miller, Charlie et al., "A Survey of Remote Automotive Attack Surfaces", http://www.ioactive.com/pdfs/Remote_Automotive_Attack_Surfaces.pdf, as accessed Aug. 29, 2014, Black Hat USA 2014, Las Vegas, NV, (Aug. 2-7, 2014).

Regev, Alon et al., "Automotive Ethernet Security Testing", http://standards.ieee.org/events/automotive/2014/20_Automotive_Ethernet_Security_Testing.pdf, as accessed Feb. 9, 2015, (2014).

Koscher, Karl et al., "Experimental Security Analysis of a Modern Automobile", http://www.autosec.org/pubs/cars-oakland2010.pdf, as accessed Feb. 9, 2015, 2010 IEEE Symposium on Security and Privacy, (2010).

Bayer, Stephanie et al., "Automotive Security Testing—The Digital Crash Test", http://www.sia.fr/images/images/Image/Evenements/2014/CESA/available%20papers/09_Bayer_Escrypt.pdf, as accessed Feb. 9, 2015, 3rd CESA Automotive Electronics Congress (CESA 3.0), Paris, France, (Dec. 3-4, 2014).

"Electronic control unit", https://en.wikipedia.org/wiki/Electronic_control_unit, as accessed Feb. 9, 2015, Wikipedia, (Jul. 28, 2004).

"Vehicle bus", https://en.wikipedia.org/wiki/Vehicle_bus, as accessed Feb. 9, 2015, Wikipedia, (May 12, 2005).

"Hardware emulation", https://en.wikipedia.org/wiki/Hardware_emulation, as accessed Feb. 9, 2015, Wikipedia, (Sep. 13, 2006).

"Emulation", https://en.wikipedia.org/wiki/Emulation, as accessed Feb. 9, 2015, Wikipedia, (Dec. 3, 2003).

Nathan Evans, et al; Systems and Methods for Detecting Anomalous Messages in Automobile Networks; U.S. Appl. No. 14/525,792, filed Oct. 28, 2014.

Yun Shen, et al; Systems and Methods for Detecting Discrepancies in Automobile-Network Data; U.S. Appl. No. 14/525,715, filed Oct. 28, 2014.

Extending schedulability analysis of Controller Area Network (CAN) for mixed (periodic/sporadic) messages (http://ieeexplore.ieee.org/document/6059010/); Sep. 5, 2011.

A structured approach to anomaly detection for in-vehicle networks (http://ieeexplore.ieee.org/stamp/stamp.jsp?arnumber=5604050); Aug. 23, 2010.

Intrusion Detection Systems (IDS) Part 2—Classification; methods; techniques (http://www.windowsecurity.com/articles-tutorials/intrusion_detection/IDS-Part2-Classification-methods-techniques.html); Jun. 15, 2014.

Vishal Bajpai et al.; System and Method for Identifying an Invalid Packet on a Controller Area Network (CAN) Bus; U.S. Appl. No. 15/056,864, filed Feb. 29, 2016.

(56) References Cited

OTHER PUBLICATIONS

Vishal Bajpai et al.; Systems and Methods for Identifying Suspicious Controller Area Network Messages; U.S. Appl. No. 15/587,762, filed May 5, 2017.
Steven Noel et al.; Correlating Intrusion Events and Building Attack Scenarios Through Attack Graph Distances; 20th Annual Computer Security Applications Conference; ACSAC '04; Tucson, AZ, USA; Dec. 6-10, 2004.
Mahoney, Network traffic anomaly detection based on packet bytes, Proceedings of the 2003 ACM symposium on Applied computing, pp. 346-350, Mar. 9, 2003.
Balthrop et al., Revisiting LISYS: Parameters and Normal Behavior, Proceedings of the 2002 Congress on Evolutionary Computation, pp. 1045-1050, May 12, 2002.
Lee et al., Data mining approaches for intrusion detection, Proceedings of the 7th conference on USENIX Security Symposium—vol. 7, p. 6, Jan. 26, 1998.
Clifton et al., Developing custom intrusion detection filters using data mining, Milcom 2000. 21st Century Military Communications Conference Proceedings, vol. 1, pp. 440-443, Oct. 22, 2000.
Bloedorn et al., Data Mining for Improving Intrusion Detection, http://www.mitre.org/sites/default/files/pdf/bloedorn_spss.pdf, Sep. 18, 2015.
Lee et al., Information-theoretic measures for anomaly detection, 2001 IEEE Symposium on Security and Privacy, pp. 130-143, May 13, 2001.
Yang et al., Anomaly detection and diagnosis in grid environments, Proceedings of the 2007 ACM/IEEE conference on Supercomputing, p. 33, Nov. 10, 2007.
Wang et al., Anomalous Payload-Based Network Intrusion Detection, Seventh International Workshop on Recent Advances in Intrusion Detection, pp. 203-222, Sep. 15, 2004.
Dussel et al., Cyber-Critical Infrastructure Protection Using Real-Time Payload-Based Anomaly Detection, 4th International Workshop on Critical Information Infrastructures Security, pp. 85-97, Sep. 30, 2009.
Tongaonkar et al., Towards self adaptive network traffic classification, Computer Communications, vol. 56, pp. 35-46, Feb. 1, 2015.
Bermudez et al., Automatic protocol field inference for deeper protocol understanding, IFIP Networking Conference (IFIP Networking), 2015, pp. 1-9, May 20, 2015.
Taylor et al., Frequency-based anomaly detection for the automotive CAN bus, 2015 World Congress on Industrial Control Systems Security (WCICS), pp. 45-49, Dec. 14, 2015.
Theissler, Anomaly detection in recordings from in-vehicle networks. pdf, Big Data Applications and Principles, First International Workshop, BIGDAP 2014, Madrid, Spain, Sep. 11, 2014.
Adam Glick, et al.; Systems and Methods for User-Directed Malware Remediation; U.S. Appl. No. 13/419,360, filed Mar. 13, 2012.
Carey Nachenberg, et al.; Systems and Methods for Neutralizing File-Format-Specific Exploits Included Within Files Contained Within Electronic Communications; U.S. Appl. No. 13/418,332, filed Mar. 12, 2012.
Leylya Yumer, et al.; Systems and Methods for Analyzing Zero-Day Attacks; U.S. Appl. No. 13/901,977, filed May 24, 2013.
Kyumin Lee, et al.; Content-Driven Detection of Campaigns in Social Media; CIKM'11; Oct. 24-28, 2011; ACM; Glasgow, Scotland, UK; http://faculty.cs.tamu.edu/caverlee/pubs/lee11cikm.pdf, as accessed Aug. 8, 2013.
Monowar H. Bhuyan, et al.; AOCD: An Adaptive Outlier Based Coordinated Scan Detection Approach; International Journal of Network Security; Nov. 2012; pp. 339-351; vol. 14, No. 6; http://www.cs.uccs.edu/~jkalita/papers/2012/BhuyanMonowarIJNS2012.pdf, as accessed Aug. 8, 2013.
William Eberle, et al., Graph-based approaches to insider threat detection; CSIIRW '09 Proceedings of the 5th Annual Workshop on Cyber Security and Information Intelligence Research: Cyber Security and Information Intelligence Challenges and Strategies; 2009; Article No. 44; ACM; http://dl.acm.org/citation.cfm?id=1558658, as accessed Aug. 8, 2013.

Splunk, Inc.; Detecting Advanced Persistent Threats—Using Splunk for APT; Jan. 4, 2012; Tech Brief; http://www.splunk.com/web_assets/pdfs/secure/Splunk_for_APT_Tech_Brief.pdf, as accessed Aug. 8, 2013.
Triumfant, Inc.; Detecting the Advanced Persistent Threat; Nov. 30, 2010; www.triumfant.com/advanced_persistent_threat.asp, as accessed Aug. 8, 2013.
EMC Corporation; Advanced Persistent Threat (APT) and Rootkit Detection; 2012; http://www.siliciumsecurity.com/advanced-persistent-threats-and-rootkits-detection/, as accessed Aug. 8, 2013.
Fanglu Guo, et al; Systems and Methods for Reducing False Positives When Using Event-Correlation Graphs to Detect Attacks on Computing Systems; U.S. Appl. No. 14/031,044, filed Sep. 19, 2013.
Colombe, Jeffrey B., et al., "Statistical profiling and visualization for detection of malicious insider attacks on computer networks", http://dl.acm.org/citation.cfm?id=1029231, as accessed Nov. 13, 2013, VizSEC/DMSEC '04 Proceedings of the 2004 ACM workshop on Visualization and data mining for computer security, ACM, New York, NY, (2004), 138-142.
Wang, Wei et al., "Diffusion and graph spectral methods for network forensic analysis", http://dl.acm.org/citation.cfm?id=1278956, as accessed Nov. 13, 2013, NSPW '06 Proceedings of the 2006 workshop on New security paradigms, ACM, New York, NY, (2006), 99-106.
Julisch, Klaus "Clustering intrusion detection alarms to support root cause analysis", http://dl.acm.org/citation.cfm?id=950192, as accessed Nov. 13, 2013, ACM Transactions on Information and System Security (TISSEC), vol. 6, Issue 4, ACM, New York, NY, (Nov. 2003), 443-471.
Treinen, James J., et al., "A framework for the application of association rule mining in large intrusion detection infrastructures", http://dl.acm.org/citation.cfm?id=2166375, as accessed Nov. 13, 2013, RAID'06 Proceedings of the 9th international conference on Recent Advances in Intrusion Detection, Springer-Verlag Berlin, Heidelberg, (2006), 1-18.
Gu, Guofei et al., "BotHunter: detecting malware infection through IDS-driven dialog correlation", http://dl.acm.org/citation.cfm?id=1362915, as accessed Nov. 13, 2013, SS'07 Proceedings of 16th USENIX Security Symposium on USENIX Security Symposium, Article No. 12, USENIX Association, Berkeley, CA, (2007).
Valdes, Alfonso et al., "Probabilistic Alert Correlation", http://dl.acm.org/citation.cfm?id=670734, as accessed Nov. 13, 2013, RAID '00 Proceedings of the 4th International Symposium on Recent Advances in Intrusion Detection, Springer-Verlag, London, UK, (2001), 54-68.
Alsubhi, Khalid et al., "FuzMet: a fuzzy-logic based alert prioritization engine for intrusion detection systems", http://dl.acm.org/citation.cfm?id=2344711, as accessed Nov. 13, 2013, International Journal of Network Management, vol. 22 Issue 4, John Wiley & Sons, Inc., New York, NY, (Jul. 2012).
Zamlot, Loai et al., "Prioritizing intrusion analysis using Dempster-Shafer theory", http://dl.acm.org/citation.cfm?id=2046694, as accessed Nov. 13, 2013, AISec '11 Proceedings of the 4th ACM workshop on Security and artificial intelligence, ACM, New York, NY, (2011), 59-70.
Oliner, Adam J., et al., "Community epidemic detection using time-correlated anomalies", http://dl.acm.org/citation.cfm?id=1894191, as accessed Nov. 13, 2013, RAID'10 Proceedings of the 13th international conference on Recent advances in intrusion detection, Springer-Verlag Berlin, Heidelberg, (2010), 360-381.
Ning, Peng et al., "Constructing attack scenarios through correlation of intrusion alerts", http://reeves-students.csc.ncsu.edu/papers-and-other-stuff/2002-10-ccs-constructing-attack-scenarios-paper.pdf, as accessed Nov. 13, 2013, CCS '02 Proceedings of the 9th ACM conference on Computer and communications security, ACM, Washington, DC, (Nov. 18-22, 2002), 245-254.
Wang, Wei et al., "A Graph Based Approach Toward Network Forensics Analysis", http://dl.acm.org/citation.cfm?id=1410238, as accessed Nov. 13, 2013, ACM Transactions on Information and System Security (TISSEC), vol. 12, Issue 1, Article No. 4, ACM, New York, NY, (Oct. 2008).

(56) References Cited

OTHER PUBLICATIONS

Valeur, Fredrik et al., "A Comprehensive Approach to Intrusion Detection Alert Correlation", http://dl.acm.org/citation.cfm?id=1038251, as accessed Nov. 13, 2013, IEEE Transactions on Dependable and Secure Computing, vol. 1, Issue 3, IEEE Computer Society Press, Los Alamitos, CA, (Jul. 2004), 146-169.
Tedesco, Gianni et al., "Real-Time Alert Correlation with Type Graphs", http://dl.acm.org/citation.cfm?id=1496279, as accessed Nov. 13, 2013, ICISS '08 Proceedings of the 4th International Conference on Information Systems Security, Springer-Verlag Berlin, Heidelberg, (2008), 173-187.
Wang, Wei et al., "Network Forensics Analysis with Evidence Graphs", http://www.dfrws.org/2005/proceedings/wang_evidencegraphs.pdf, as accessed Nov. 13, 2013, 2005 Digital Forensic Research Workshop (DFRWS), New Orleans, LA, (2005).
Wang, Ting et al., "Microscopic Social Influence", http://www.cc.gatech.edu/~lingliu/papers/2012/TingWang-SDM2012.pdf, as accessed Nov. 13, 2013, SDM 2012, (2012).
Ugander, Johan et al., "Balanced Label Propagation for Partitioning Massive Graphs", https://people.cam.cornell.edu/~jugander/papers/wsdm13-blp.pdf, as accessed Nov. 13, 2013, WSDM'13, ACM, Rome, Italy, (Feb. 4-8, 2013).
Ayday, Erman et al., "Iterative Trust and Reputation Management Using Belief Propagation", http://www.ece.gatech.edu/research/labs/WCCL/BP_publications/BP-ITRM-journal.pdf, as accessed Nov. 13, 2013, IEEE Transactions on Dependable and Secure Computing, vol. 9, No. 3, IEEE Computer Society, (May/Jun. 2012), 375-386.
Bruce McCorkendale, et al; Systems and Methods for Detecting Malware; U.S. Appl. No. 13/422,702, filed Mar. 16, 2012.
Acar Tamersoy, et al; Systems and Methods for Adjusting Suspiciousness Scores in Event-Correlation Graphs; U.S. Appl. No. 14/138,891, filed Dec. 23, 2013.
Paleari, Roberto et al., "Automatic Generation of Remediation Procedures for Malware Infections", https://www.usenix.org/legacy/event/sec10/tech/full_papers/Paleari.pdf, as accessed Feb. 6, 2014, USENIX Security'10 Proceedings of the 19th USENIX conference on Security, USENIX Association, Berkeley, CA, (2010).
"Combating Advanced Persistent Threats—How to prevent, detect, and remediate APTs", http://www.mcafee.com/us/resources/white-papers/wp-combat-advanced-persist-threats.pdf, as accessed Feb. 6, 2014, McAfee, Inc., Santa Clara, CA, (2011).
"Advanced Persistent Threat (APT) Attack & Zero-Day Protection", http://www.fireeye.com/, as accessed Feb. 6, 2014, Fire Eye, Inc., (2006).
"Advanced Threat Defense", http://www.fidelissecurity.com/advanced-persistent-threat-protection, as accessed Feb. 6, 2014, General Dynamics Fidelis Cybersecurity Solutions, Inc., (2013).
"Mandiant for Security Operations", https://www.mandiant.com/products/mandiant-platform/security-operations, as accessed Feb. 6, 2014, Mandiant, A FireEye Company, (Mar. 1, 2013).
"Mandiant for Intelligent Response", http://www.mandiant.com/products/mandiant-platform/intelligent-response, as accessed Feb. 6, 2014, Mandiant, A FireEye Company, (Mar. 1, 2013).
"Solera Networks Inc.", http://www.soleranetworks.com/, as accessed Feb. 6, 2014, (Feb. 16, 2005).
"LogRhythm, Inc.", http://www.logrhythm.com/, as accessed Feb. 6, 2014, (Oct. 18, 2000).
Kevin Alejandro Roundy, et al; Systems and Methods for Using Event-Correlation Graphs to Generate Remediation Procedures; U.S. Appl. No. 14/221,703, filed Mar. 21, 2014.
Eberle, William et al., "Insider Threat Detection Using Graph-Bases Approaches", http://www.eecs.wsu.edu/-holder/pubs/EberleCATCH09.pdf, Cybersecurity Applications & Technology Conference for Homeland Security, (Jan. 2009).
Constantin, Lucian, "Attackers used known exploit to steal customer log-in credentials, vBulletin maker says", http://www.networkworld.com/article/2171967/access-control/attackers-used-known-exploit-to-steal-customer-log-in-credentials--vbulletin-maker-sa.html, IDG News Service, Network World, (Nov. 18, 2013).

"Recovery Manager for Active Directory Forest Edition", http://software.dell.com/documents/recovery-manager-for-active-directory-forest-edition-datasheet-26622.pdf, Dell, Inc., (Nov. 2013).
Scarfone, Karen et al., "Guide to Intrusion Detection and Prevention Systems (IDPS)", http://csrc.nist.gov/publications/nistpubs/800-94/SP800-94, National Institute of Standards and Technology, Special Publication 800-94, (Feb. 2007).
Dezert, Jean et al., "On the Validity of Dempster-Shafer Theory", Fusion 2012—15th International Conference on Information Fusion, Singapour, Singapore, (Jul. 2012).
Kevin Roundy, et al; Systems and Methods for Using Event-Correlation Graphs to Detect Attacks on Computing Systems; U.S. Appl. No. 14/041,762, filed Sep. 30, 2013.
Ilya Sokolov, et al; Systems and Methods for Notifying Contacts About the Status of Persons Impacted by Significant Unforeseen Events; U.S. Appl. No. 14/525,244, filed Oct. 28, 2014.
"Google now", http://www.google.com/landing/now/#whatisit, as accessed Aug. 28, 2014, (Jun. 28, 2012).
"Bing Maps", http://www.bing.com/maps/, as accessed Aug. 28, 2014, (Jun. 11, 2009).
"Google Now", https://plus.google.com/+google/posts/WhNRboMLynU, as accessed Aug. 18, 2015, (Mar. 29, 2014).
Keith Newstadt, et al; Systems and Methods for Validating Login Attempts Based on User Location; U.S. Appl. No. 14/197,687, filed Mar. 5, 2014.
Keith Newstadt; Systems and Methods for Validating Login Attempts Based on User Location; U.S. Appl. No. 14/735,195, filed Jun. 10, 2015.
Michael Shavell, et al; Systems and Methods for Storing Information About Transmission Control Protocol Connections; U.S. Appl. No. 14/314,263, filed Jun. 25, 2014.
Haas, Juergen; Syn flood; http://linux.about.com/cs/linux101/g/synflood.htm, as accessed Jul. 10, 2014; About.com.
Shane Pereira; Systems and Methods for Thwarting Illegitimate Initialization Attempts; U.S. Appl. No. 14/485,287, filed Sep. 12, 2014.
Hobgood, et al., Advanced Automatic Crash Notifications and, Urgency Factors: Can We Standardize?, APCO 2011, PowerPoint Slides, Jul. 22, 2012.
Asi, et al., Black Box System Design, Dec. 14, 2010.
Ignacio Bermudez Corrales, et al; Systems and Methods for Identifying Compromised Devices Within Industrial Control Systems; U.S. Appl. No. 14/952,344, filed Nov. 25, 2015.
Bolzoni; Poseidon: a 2-tier Anomaly-based Intrusion Detection System; http://doc.utwente.nl/54544/1/00000150.pdf, as accessed Sep. 29, 2015; International Workshop on Information Assurance, IEEE, London.
Caselli; Sequence-aware Intrusion Detection in Industrial Control Systems; CPSS'15, Proceedings of the 1st ACM Workshop on Cyber-Physical System Security, 2015.
Cisco Anomaly Guard Module; http://www.cisco.com/c/en/us/products/collateral/interfaces-modules/catalyst-6500-7600-router-anomaly-guard-module/product_data_sheet0900aecd80220a7c.html, as accessed Sep. 29, 2015; Document ID1457308823644728.
Distributed control system; https://en.wikipedia.org/wiki/Distributed_control_system, as accessed Sep. 29, 2015; Wikipedia.
Garitano; A Review of SCADA Anomaly Detection Systems; Advances in Intelligent and Soft Computing, 2016.
Ginter; Experience with Network Anomaly Detection on Industrial Networks; Industrial Control Systems Joint Working Group (ICSJWG), 2010.
Hadziosmanovi; N-Gram against the Machine: On the Feasibility of the N-Gram Network Analysis for Binary Protocols; Research in Attacks, Intrusions, and Defenses. 2012.
Kiss; Data Clustering-based Anomaly Detection in Industrial Control Systems; Intelligent Computer Communication and Processing, IEEE. 2014.
Mahoney; Phad: Packet Header Anomaly Detection for Identifying Hostile Network Traffic; https://cs.fit.edu/~mmahoney/paper3.pdf, as accessed Sep. 29, 2015.
Mantere; Network Traffic Features for Anomaly Detection in Specific Industrial Control System Network; Future Internet 2013, vol. 5 (6), MDPI.

(56) References Cited

OTHER PUBLICATIONS

Perdisci; McPad: A Multiple Classifier System for Accurate Payload-based Anomaly Detection; https://pralab.diee.unica.it/sites/default/files/Perdisci_COMNET2009.pdf, as accessed Sep. 29, 2015; Computer Networks, vol. 53, Issue 6.
Snort (software); https://en.wikipedia.org/wiki/Snort_(software), as accessed Sep. 29, 2015; Wikipedia.
The Bro Network Security Monitor; https://www.bro.org/, as accessed Sep. 29, 2015.
Wang; Anagram: A Content Anomaly Detector Resistant to Mimicry Attack; https://mice.cs.columbia.edu/getTechreport.php?techreportID=403&format=pdf&, as accessed Sep. 29, 2015; Recent Advances in Intrusion Detection.
Wang; Anomalous Payload-based Network Intrusion Detection; http://www.covert.io/research-papers/security/PAYL%20-%20Anomalous%20Payload-based%20Network%20Intrusion%20Detection.pdf, as accessed Sep. 29, 2015; Recent Advances in Intrusion Detection.
Walter Bogorad; Systems and Methods for Detecting Anomalies That are Potentially Indicative of Malicious Attacks; U.S. Appl. No. 15/059,326, filed Mar. 3, 2016.
Aggarwal; Outlier Analysis; http://www.springer.com/us/book/9781461463955, as accessed Feb. 1, 2016, (2013).
Dunning; Practical Machine Learning: A New Look at Anomaly Detection; https://www.mapr.com/practical-machine-learning-new-look-anomaly-detection, as accessed Feb. 1, 2016, (Jul. 21, 2014).
Kind; Histogram-based traffic anomaly detection; http://ieeexplore.ieee.org/document/5374831/?arnumber=5374831, as accessed Feb. 1, 2016; IEEE Transactions on Network and Service Management, vol. 6, Issue 2, (Jun. 2009).
Wang; Network anomaly detection: A survey and comparative analysis of stochastic and deterministic methods; http://ieeexplore.ieee.org/document/6759879/?arnumber=6759879, as accessed Feb. 1, 2016; 2013 IEEE 52nd Annual Conference on Decision and Control (CDC), (Dec. 10-13, 2013).
Yolacan; Learning From Sequential Data for Anomaly Detection; https://repository.library.northeastern.edu/downloads/neu:349795, as accessed Feb. 1, 2016; Dissertation, (Oct. 2014).
Michael Sylvester Pukish, et al; Systems and Methods for Detecting Obscure Cyclic Application-Layer Message Sequences in Transport-Layer Message Sequences; U.S. Appl. No. 15/271,494, filed 21 Sep. 2016.
K. Nyalkalkar et al., "A comparative study of two network-based anomaly detection methods," in 2011 Proceedings IEEE INFOCOM, 2011.
S. Sinha et al., "WIND: Workload-Aware INtrusion Detection," in Recent Advances in Intrusion Detection, D. Zamboni and C. Kruegel, Eds. Springer Berlin Heidelberg, 2006.
L. Huang et al., "In-network PCA and anomaly detection," in in NIPS, 2006.
N. Goldenberg et al., "Accurate modeling of Modbus/TCP for intrusion detection in SCADA systems," Int. J. Crit. Infrastruct. Prot., vol. 6, No. 2, Jun. 2013.
M.-K. Yoon et al., "Communication Pattern Monitoring: Improving the Utility of Anomaly Detection for Industrial Control Systems," in Internet Society, San Diego, CA, USA, 2014.
N. Borisov et al., "Generic Application-Level Protocol Analyzer and its Language," Microsoft Research, MSR-TR-2005-133, Feb. 2005.
Zhipeng Zhao et al.; Systems and Methods for Identifying Message Payload Bit Fields in Electronic Communications; U.S. Appl. No. 15/359,076, filed Nov. 22, 2016.
"Transmission Control Protocol", http://en.wikipedia.org/wiki/Transmission_Control_Protocol, as accessed Jul. 10, 2014, Wikipedia, (Dec. 18, 2003).
A. Greenberg, "Hackers Remotely Kill a Jeep on the Highway—With Me in It," WIRED, Jul. 21, 2015. [Online]. Available: http://www.wired.com/2015/07/hackers-remotely-kill-jeep-highway/. [Accessed: Mar. 30, 2016].
Pukish et al., U.S. Appl. No. 15/194,337, filed Jun. 27, 2016.
Muter et al., A structured approach to anomaly detection for in-vehicle networks, 2010 Sixth International Conference on Information Assurance and Security (IAS), pp. 92-98, Aug. 23, 2010.

* cited by examiner

SYSTEMS AND METHODS FOR EVALUATING ELECTRONIC CONTROL UNITS WITHIN VEHICLE EMULATIONS

BACKGROUND

Modern vehicles such as cars and boats increasingly contain embedded devices called "electronic control units" for improving the performance of these vehicles and the experience of the passengers within them. Manufacturers and others may embed electronic control units within vehicles to more accurately control and regulate lower-level engine and mechanical functionality. For example, electronic control units may control and regulate engine component activation, temperature, and/or performance level. Other electronic control units may provide higher level, and less critical, functionality, such as controlling a radio, stereo system, television system, navigation system, and/or voice recognition interface.

In some systems, manufacturers and others may test the performance of electronic control units by embedding them within vehicles and then operating the vehicles to check how the electronic control units respond and function. Alternatively, manufacturers and others may input generic commands, which are specified by the manufacturer, to ensure that the electronic control unit performs the expected function in response to the command. These safety testing procedures may both be inefficient (e.g., because they involve embedding the electronic control unit within an operating vehicle) and incomplete (e.g., because they simply test whether the electronic control unit, in relative isolation, performs specified functions in response to corresponding commands according to manufacturer specifications). Accordingly, the instant disclosure identifies and addresses a need for additional and improved systems and methods for evaluating electronic control units.

SUMMARY

As will be described in greater detail below, the instant disclosure generally relates to systems and methods for evaluating electronic control units within vehicle emulations by, for example, emulating ordinary, recorded, and/or manipulated network traffic within a vehicle bus, providing the network traffic to an isolated electronic control unit, and evaluating the output from the electronic control unit for safety purposes, as discussed further below. In one example, a computer-implemented method for evaluating electronic control units within vehicle emulations may include (1) connecting an actual electronic control unit for a vehicle to a vehicle bus that emulates network traffic rather than actual network traffic generated by operation of the vehicle such that the emulated network traffic includes network traffic from an emulation of another electronic control unit, (2) manipulating input to the actual electronic control unit to test how safely the actual electronic control unit and the emulated electronic control unit respond to the manipulated input, (3) detecting an output from the actual electronic control unit that indicates a response, from the actual electronic control unit, to manipulating the input, and (4) evaluating a safety level of at least one of the actual electronic control unit and the emulated electronic control unit based on detecting the output from the actual electronic control unit.

In some examples, the computer-implemented method may further include recording actual network traffic generated by operation of the vehicle. In one embodiment, the vehicle bus emulates network traffic by replaying the recorded actual network traffic.

In some examples, connecting the actual electronic control unit for the vehicle to the vehicle bus is performed without integrating the actual electronic control unit within the vehicle. In further examples, manipulating input to the actual electronic control unit may include fuzzing the input by altering the input to include at least one of random input and invalid input.

In one embodiment, the emulated network traffic includes network traffic from emulations of other electronic control units. In further embodiments, the vehicle bus corresponds to (1) the FLEXRAY protocol, (2) the CONTROLLER AREA NETWORK protocol, and/or (3) the MEDIA ORIENTED SYSTEMS TRANSPORT protocol.

In some examples, detecting the output from the actual electronic control unit may include detecting network traffic output from the actual electronic control unit to the vehicle bus and/or detecting a change in a physical state of the actual electronic control unit. In further examples, evaluating the safety level may include evaluating a safety level of the emulated electronic control unit based on detecting the output from the actual electronic control unit. In some examples, evaluating the safety level may include determining that the manipulated input caused at least one of the actual electronic control unit and the emulated control unit to create an emulation of a dangerous physical condition within the vehicle.

In one embodiment, a system for implementing the above-described method may include (1) a connection module, stored in memory, that connects an actual electronic control unit for a vehicle to a vehicle bus that emulates network traffic rather than actual network traffic generated by operation of the vehicle such that the emulated network traffic includes network traffic from an emulation of another electronic control unit, (2) a manipulation module, stored in memory, that manipulates input to the actual electronic control unit to test how safely the actual electronic control unit and the emulated electronic control unit respond to the manipulated input, (3) a detection module, stored in memory, that detects an output from the actual electronic control unit that indicates a response, from the actual electronic control unit, to manipulating the input, (4) an evaluation module, stored in memory, that evaluates a safety level of at least one of the actual electronic control unit and the emulated electronic control unit based on detecting the output from the actual electronic control unit, and (5) at least one physical processor configured to execute the connection module, the manipulation module, the detection module, and the evaluation module.

In some examples, the above-described method may be encoded as computer-readable instructions on a non-transitory computer-readable medium. For example, a computer-readable medium may include one or more computer-executable instructions that, when executed by at least one processor of a computing device, may cause the computing device to (1) connect an actual electronic control unit for a vehicle to a vehicle bus that emulates network traffic rather than actual network traffic generated by operation of the vehicle such that the network traffic includes network traffic from an emulation of another electronic control unit, (2) manipulate input to the actual electronic control unit to test how safely the actual electronic control unit and the emulated electronic control unit respond to the manipulated input, (3) detect an output from the actual electronic control unit that indicates a response, from the actual electronic control unit, to manipulating the input, and (4) evaluate a safety level of at least one of the actual electronic control unit and the emulated electronic control unit based on detecting the output from the actual electronic control unit.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
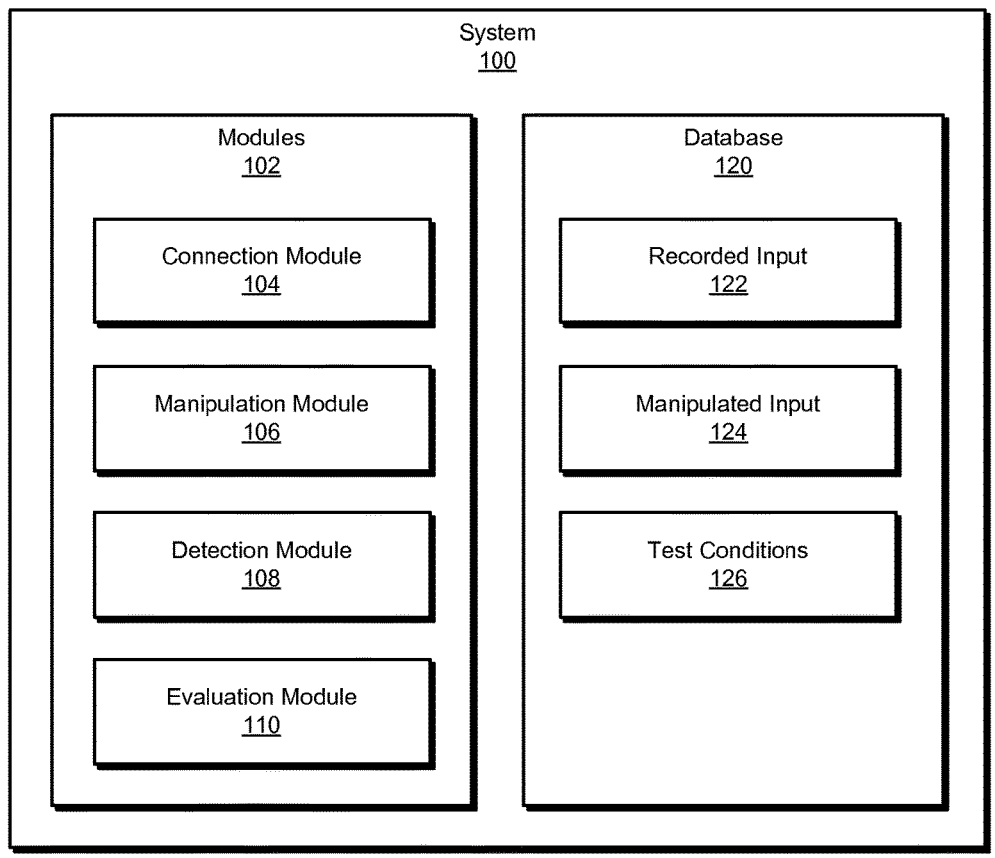
FIG. 1 is a block diagram of an exemplary system for evaluating electronic control units within vehicle emulations.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for evaluating electronic control units within vehicle emulations. As will be explained in greater detail below, the disclosed systems and methods may enable a testing facility to evaluate the safety of an electronic control unit without embedding the electronic control unit within an operating vehicle. Similarly, the disclosed systems and methods may enable the testing facility to evaluate the safety of the electronic control unit within an emulated environment in which the electronic control unit coordinates with, and responds to, network traffic from other emulated electronic control units. In general, these emulation testing techniques can identify safety threats, and other dangerous conditions, even when all or some of the electronic control units (including the actual electronic control unit) satisfy manufacturer specifications by performing specified functions in response to corresponding commands.

Figure 2:
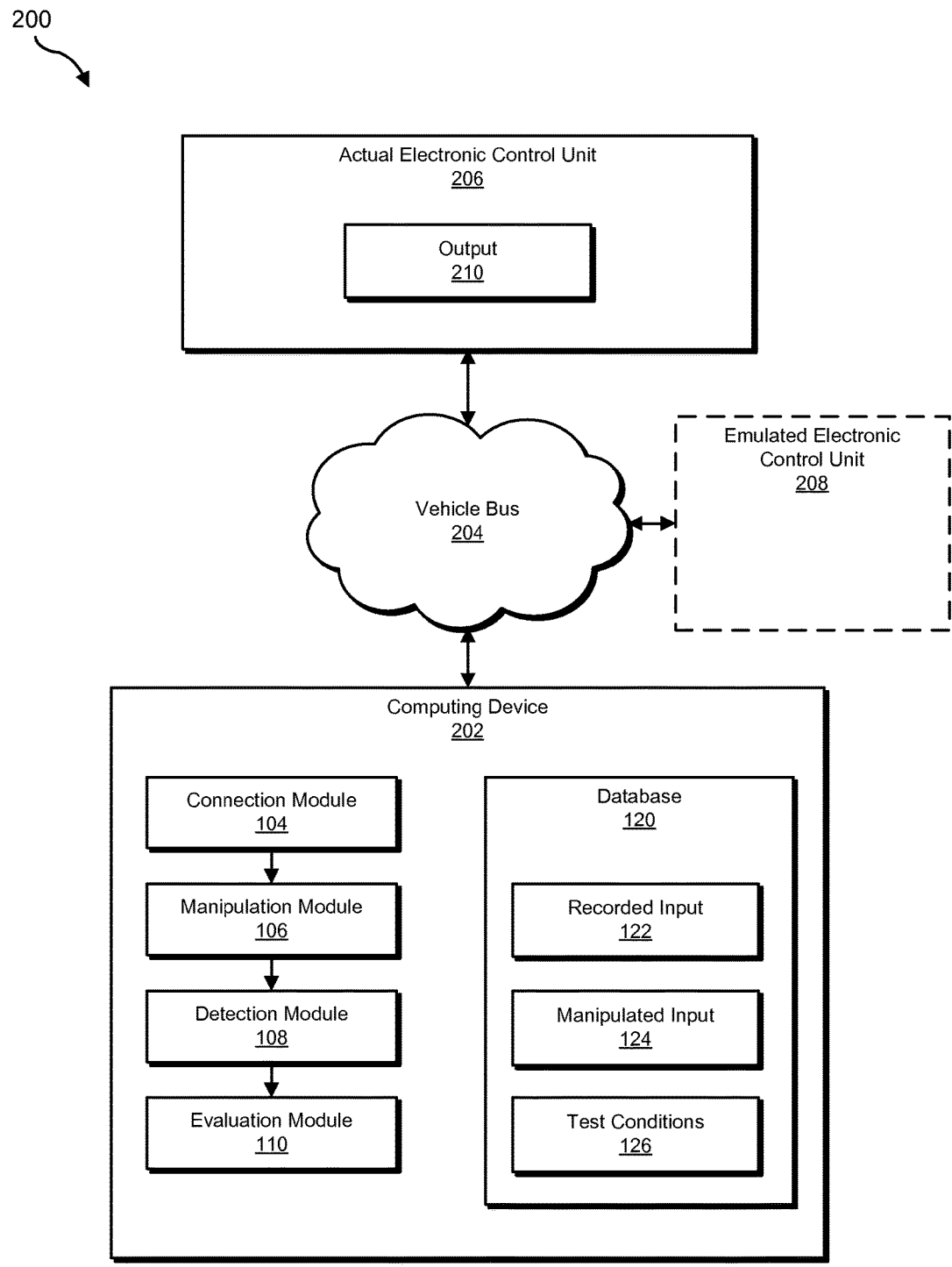
FIG. 2 is a block diagram of an additional exemplary system for evaluating electronic control units within vehicle emulations.

The following will provide, with reference to FIGS. 1-2, detailed descriptions of exemplary systems for evaluating electronic control units within vehicle emulations. Detailed descriptions of corresponding computer-implemented methods will also be provided in connection with FIGS. 3-5. In addition, detailed descriptions of an exemplary computing system and network architecture capable of implementing one or more of the embodiments described herein will be provided in connection with FIGS. 6 and 7, respectively.

FIG. 1 is a block diagram of exemplary system 100 for evaluating electronic control units within vehicle emulations. As illustrated in this figure, exemplary system 100 may include one or more modules 102 for performing one or more tasks. For example, and as will be explained in greater detail below, exemplary system 100 may also include a connection module 104 that may connect an actual electronic control unit for a vehicle to a vehicle bus that emulates network traffic rather than actual network traffic generated by operation of the vehicle. The emulated network traffic may include network traffic from an emulation of another electronic control unit. Exemplary system 100 may additionally include a manipulation module 106 that may manipulate input to the actual electronic control unit to test how safely the actual electronic control unit and the emulated electronic control unit respond to the manipulated input. Exemplary system 100 may also include a detection module 108 that may detect an output from the actual electronic control unit that indicates a response, from the actual electronic control unit, to manipulating the input. Exemplary system 100 may additionally include an evaluation module 110 that may evaluate a safety level of the actual electronic control unit and/or the emulated electronic control unit based on detecting the output from the actual electronic control unit. Although illustrated as separate elements, one or more of modules 102 in FIG. 1 may represent portions of a single module or application.

In certain embodiments, one or more of modules 102 in FIG. 1 may represent one or more software applications or programs that, when executed by a computing device, may cause the computing device to perform one or more tasks. For example, and as will be described in greater detail below, one or more of modules 102 may represent software modules stored and configured to run on one or more computing devices, such as the devices illustrated in FIG. 2 (e.g., computing device 202 and/or actual electronic control unit 206), computing system 610 in FIG. 6, and/or portions of exemplary network architecture 700 in FIG. 7. One or more of modules 102 in FIG. 1 may also represent all or portions of one or more special-purpose computers configured to perform one or more tasks.

As illustrated in FIG. 1, exemplary system 100 may also include one or more databases, such as database 120. In one example, database 120 may be configured to store recorded input 122, which may correspond to network traffic recorded during actual operation of a vehicle. The recorded network traffic may be input to the actual electronic control unit as part of an emulation or laboratory test, as discussed further below. Database 120 may also be configured to store manipulated input 124, which may correspond to data that has been manipulated to test how the actual electronic control unit responds. In another example, database 120 may be configured to store test conditions 126, which may specify conditions and thresholds for testing the response of the actual electronic control unit to recorded input 122 and/or manipulated input 124, as discussed further below.

Database 120 may represent portions of a single database or computing device or a plurality of databases or computing devices. For example, database 120 may represent a portion of actual electronic control unit 206 in FIG. 2, computing system 610 in FIG. 6, and/or portions of exemplary network architecture 700 in FIG. 7. Alternatively, database 120 in FIG. 1 may represent one or more physically separate devices capable of being accessed by a computing device, such as actual electronic control unit 206 in FIG. 2, computing system 610 in FIG. 6, and/or portions of exemplary network architecture 700 in FIG. 7.

Exemplary system 100 in FIG. 1 may be implemented in a variety of ways. For example, all or a portion of exemplary system 100 may represent portions of exemplary system 200 in FIG. 2. As shown in FIG. 2, system 200 may include a computing device 202 in communication with actual electronic control unit 206 via a vehicle bus 204. In one example, computing device 202 may be programmed with one or more of modules 102 and/or may store all or a portion of the data in database 120. Additionally or alternatively, actual electronic control unit 206 may be programmed with one or more of modules 102 and/or may store all or a portion of the data in database 120. Computing device 202 may correspond to an emulation unit and/or a testing unit, as discussed further below.

In one embodiment, one or more of modules 102 from FIG. 1 may, when executed by at least one processor of computing device 202 and/or actual electronic control unit 206, enable computing device 202 and/or actual electronic control unit 206 to evaluate electronic control units within vehicle emulations. For example, and as will be described in greater detail below, connection module 104 may connect actual electronic control unit 206 for a vehicle to vehicle bus 204 that emulates vehicle bus traffic rather than actual vehicle bus traffic generated by operation of the vehicle. The emulated vehicle bus traffic may include vehicle bus traffic from an emulation of another electronic control unit, such as emulated electronic control unit 208. Manipulation module 106 may manipulate input to actual electronic control unit 206 to test how safely actual electronic control unit 206 and emulated electronic control unit 208 respond to the manipulated input, such as manipulated input 124. Detection module 108 may detect output 210 from actual electronic control unit 206 that indicates a response, from actual electronic control unit 206, to manipulating the input. Evaluation module 110 may evaluate a safety level, as specified by test conditions 126, of actual electronic control unit 206 and/or emulated electronic control unit 208 based on detecting output 210 from actual electronic control unit 206.

Computing device 202 generally represents any type or form of computing device capable of reading computer-executable instructions. Examples of computing device 202 include, without limitation, laptops, tablets, desktops, servers, cellular phones, Personal Digital Assistants (PDAs), multimedia players, embedded systems, wearable devices (e.g., smart watches, smart glasses, etc.), gaming consoles, combinations of one or more of the same, exemplary computing system 610 in FIG. 6, or any other suitable computing device. In general, computing device 202 may function as an emulation unit and/or a testing unit for emulating network traffic on vehicle bus 204 and testing a response from actual electronic control unit 206, as discussed further below.

Figure 3:
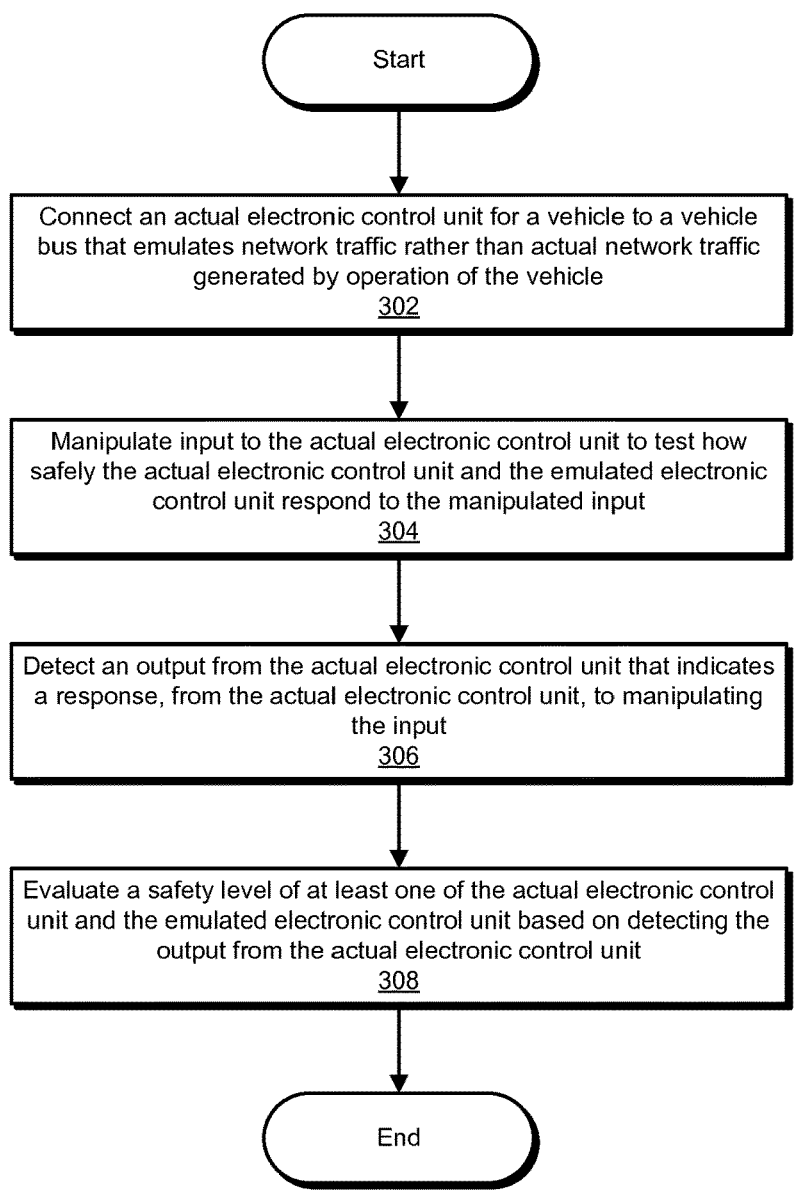
FIG. 3 is a flow diagram of an exemplary method for evaluating electronic control units within vehicle emulations.

FIG. 3 is a flow diagram of an exemplary computer-implemented method 300 for evaluating electronic control units within vehicle emulations. The steps shown in FIG. 3 may be performed by any suitable computer-executable code and/or computing system. In some embodiments, the steps shown in FIG. 3 may be performed by one or more of the components of system 100 in FIG. 1, system 200 in FIG. 2, computing system 610 in FIG. 6, and/or portions of exemplary network architecture 700 in FIG. 7.

As illustrated in FIG. 3, at step 302, one or more of the systems described herein may connect an actual electronic control unit for a vehicle to a vehicle bus that emulates network traffic rather than actual network traffic generated by operation of the vehicle. The emulated network traffic may include network traffic from an emulation of another electronic control unit. For example, connection module 104 may, as part of computing device 202 in FIG. 2, connect actual electronic control unit 206 for a vehicle to vehicle bus 204 that emulates vehicle bus traffic rather than actual vehicle bus traffic generated by operation of the vehicle.

As used herein, the term "electronic control unit" generally refers to an embedded electronic device for embedding within a vehicle to perform one or more functions within the vehicle at least in part by communicating through a vehicle bus, such as vehicle bus 204. Electronic control units may perform functions that are critical for safe and/or effective operation of the vehicle, such as monitoring, regulating, managing, and/or protecting one or more engine or mechanical components within the vehicle. For example, electronic control units may regulate engine performance, temperature, and/or functionality. Electronic control units may also function as failsafe devices that prevent and/or moderate input that would otherwise cause a dangerous condition for passengers within the vehicle. In other examples, electronic control units may control, manage, and/or regulate higher-level, recreational, and/or luxurious vehicle features, such as radio systems, television systems, speaker systems, air conditioning and heating systems, navigation systems, and/or user interface and voice recognition systems, as discussed further below. In all of these examples, electronic control units may send and receive network data to each other and other vehicle components through a vehicle bus, as discussed below.

As used herein, the term "vehicle bus" generally refers to a specialized internal communications network that interconnects components inside of a vehicle, such as an automobile, bus, train, industrial or agricultural vehicle, ship, and/or aircraft. In some examples, the vehicle bus may include one or more features that provide a benefit specifically suited for network communications within a vehicle. These features may include assurance of message delivery, assurance of non-conflicting messages, assurance of a minimum time of delivery, electromagnetic field noise resilience, and/or redundant routing. In some examples, the vehicle bus may be configured according to one or more of: (1) the FLEXRAY protocol, (2) the CONTROLLER AREA NETWORK protocol, (3) the MEDIA ORIENTED SYSTEMS TRANSPORT protocol, (4) the AVIONICS FULL-DUPLEX SWITCHED ETHERNET protocol, (5) the BYTEFLIGHT protocol, (6) the DOMESTIC DIGITAL BUS protocol, (7) the DC-BUS protocol, (8) the SOCIETY OF AUTOMOTIVE ENGINEERS protocols (J1708, J1587, J1850, and/or J1939), (9) the LOCAL INTERCONNECT NETWORK protocol, and/or (10) the VEHICLE AREA NETWORK protocol.

Moreover, as used herein, the term "vehicle bus that emulates network traffic" generally refers to any emulation of the network traffic that would occur on a vehicle bus during operation of the vehicle. More specifically, the phrase "emulates" generally refers to a simulation or virtualization of network traffic and/or network components such that a network device, such as actual electronic control unit 206, receiving network traffic from the emulation would interpret, and respond to, the network traffic as if the network device were functioning within a vehicle that is actually operating. Notably, in these cases, the network device may not actually be embedded within a vehicle, the vehicle may not actually be operating in one or more capacities (the engine may be off and/or one or more electrical systems may be down), and/or one or more other electronic control units may also be absent from the vehicle (i.e., the other electronic control units may be emulated as well, as discussed further below). Furthermore, the phrase "operation of the vehicle" generally refers to operation of an engine, a mechanical, electrical, and/or computer component of the vehicle, such as ordinary driving or transport functionality of the vehicle according to its natural and intended use.

Additionally, as used herein, the term "emulation of another electronic control unit" generally refers to an emulation, as discussed above, not just of traffic on a vehicle bus, but also of specific traffic from another electronic control unit. In these cases, the other electronic control unit may not actually be connected to the vehicle bus and/or connected to the actual electronic control unit. Rather, a simplified or virtualized version of the emulated electronic control unit, which may execute on computing device 202, may provide network traffic back and forth between the emulated electronic control unit and the actual electronic control unit (e.g., via vehicle bus 204).

Connection module 104 may connect the actual electronic control unit for a vehicle to the vehicle bus emulation in a variety of ways. In some examples, connection module 104 may instruct, or receive a command to, physically connect the actual electronic control unit to a port or terminal for the vehicle bus emulation. For example, the port or terminal may be associated with a single physical bus, router, gateway, and/or other device. Although this particular device may be physical in nature, the network traffic for the vehicle bus may be emulated, as outlined above, in the sense that one or more vehicle components, including one or more electronic control units, may be emulated (and their associated traffic may be emulated) without these components being physically connected to the vehicle bus. In other examples, connection module 104 may connect the actual electronic control unit to the vehicle bus by establishing a network-layer or software-layer connection between the actual electronic control unit and the vehicle bus after the actual electronic control unit has already been physically connected to the port or terminal (i.e., at some indefinite time in the past). In some examples, connection module 104, a safety testing technician, and/or a combination of these two in coordination with each other may perform any or all of step 302 within FIG. 3.

In some examples, connection module 104 and/or another component within system 100 may record actual network traffic generated by operation of the vehicle. For example, connection module 104, another component within system 100, and/or a lab technician may operate the vehicle, connect the vehicle bus, network components, and/or electronic control units to a sensor or a recording device, and/or record network traffic generated during operation of the vehicle. Connection module 104 may thereby generate recorded input 122 within database 120, as discussed above. In another embodiment, the vehicle bus may emulate network traffic by replaying the recorded actual network traffic and/or by inputting manipulated input 124, which may optionally include a manipulated or modified version of recorded input 122. The replaying of the recorded, or modified recorded, network traffic may place the electronic control unit within a normal operating mode in which it can be safety tested, as discussed below (in other words, to place the electronic control unit within a normal operating mode in which it can be safety tested, the electronic control unit may require or benefit from "background noise" that emulates or simulates network traffic during normal operation of the vehicle).

In one specific example, connection module 104 may connect the actual electronic control unit for the vehicle to the vehicle bus without integrating the actual electronic control unit within the vehicle. Accordingly, the disclosed systems and methods may overcome challenges and inefficiencies associated with other testing systems that involve the embedding of the electronic control unit within the vehicle (i.e., during operation of the vehicle) in order to test the safety and performance of the electronic control unit.

Figure 4:
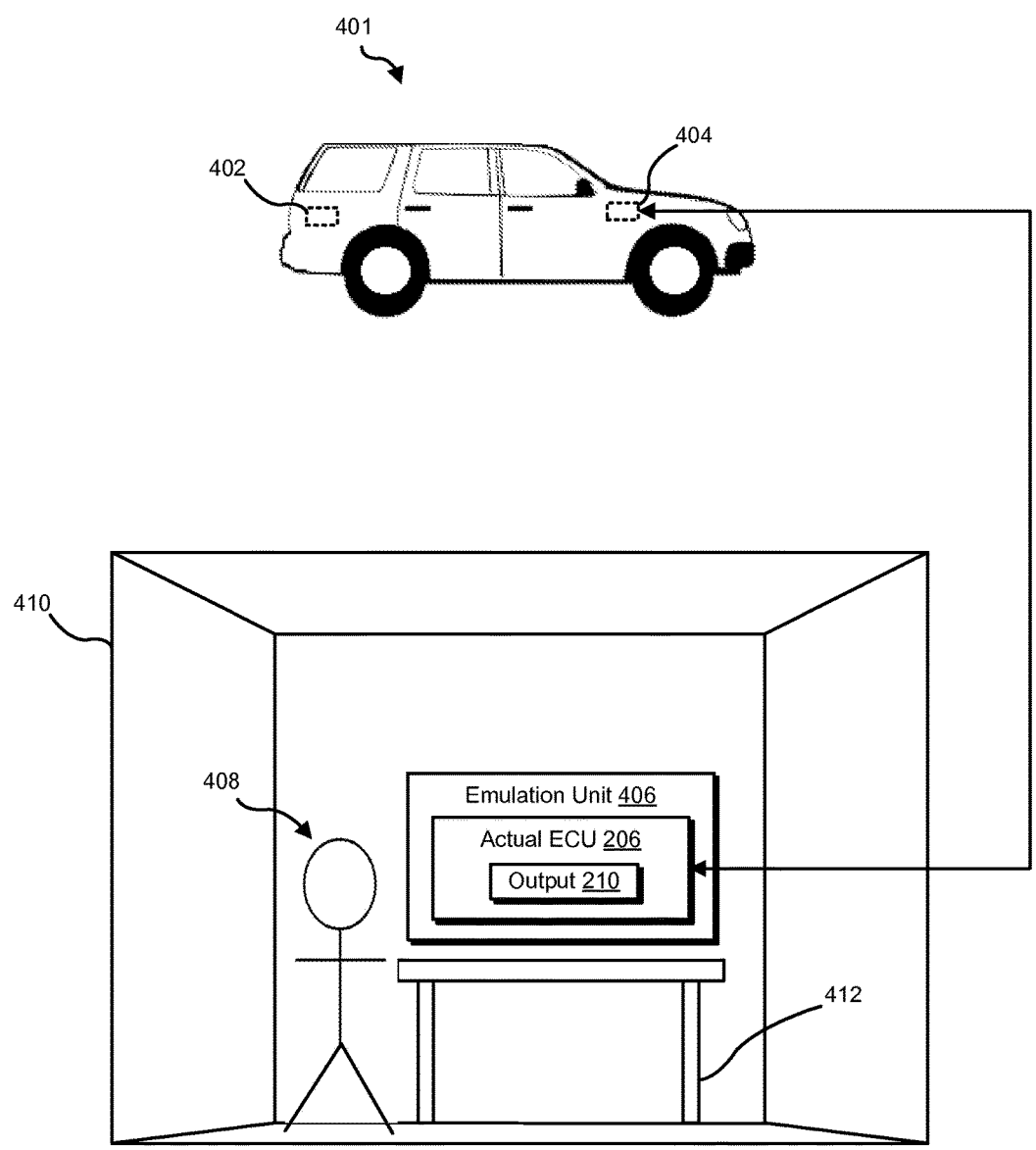
FIG. 4 is a block diagram of an exemplary vehicle and emulation testing laboratory for evaluating electronic control units within vehicle emulations.

In another embodiment, the emulated network traffic may include network traffic from a multitude of emulations of other electronic control units. In the example of FIG. 2, vehicle bus 204 may forward network traffic from emulated electronic control unit 208. Similarly, FIG. 4 shows a vehicle 401 that may include both an electronic control unit 402 and an electronic control unit 404. Nevertheless, modern vehicles may include a larger number of electronic control units than two. Specifically, modern vehicles may include a dozen or more electronic control units of some nature, including both lower-level electronic control units that perform critical engine, mechanical, performance, and/or safety features, as well as higher-level electronic control units that provide more recreational and luxury-oriented features.

Notably, just as system 100 may include a multitude of emulations of other electronic control units, system 100 may also include a multitude of actual electronic control units. In fact, system 100 may include any permutation of actual and emulated electronic control units that is not otherwise inconsistent with the method of FIG. 3, as discussed further below. Nevertheless, a primary benefit, in terms of convenience and efficiency, of the disclosed systems and methods may result from emulating more, rather than fewer, electronic control units.

In some examples, the emulated network traffic may include network traffic from any two or more of these electronic control units (i.e., the actual electronic control unit and emulations of one or more of any other remaining electronic control units). In one embodiment, the emulated network traffic may include emulations of every other electronic control unit within the vehicle other than the actual electronic control unit under physical testing. In other examples, the related network traffic may include emulations of electronic control units associated with a specific field, functionality, area, and/or interconnected set of components without including emulations of other electronic control units that are not directly (or indirectly) associated with that particular field or functionality. For example, test conditions 126 may define the specific fields, functionality, area, and/or interconnected set of components by specifying which specific electronic control units are associated with that specific field. Examples of specific fields or spheres of functionality may include the engine, a specific engine component, an interconnected group of engine components, climate control, radio, braking, navigation, the user interface, and/or a safety system, for example.

Returning to the example of FIG. 4, a lab technician 408 and/or connection module 104 may connect electronic control unit 404, within vehicle 401, to an emulation unit 406 (e.g., on a table 412) for testing how safely electronic control unit 404 responds to the manipulation of input. In this example, electronic control unit 404 may correspond to actual electronic control unit 206. Similarly, emulation unit 406 may correspond to computing device 202, which may emulate vehicle bus 204. Computing device 202 may itself emulate vehicle bus 204 or, instead, may emulate vehicle bus 204 in connection with one or more centralized physical ports, terminals, buses, bridges, routers, and/or gateways, as discussed above. Notably, as shown in FIG. 4, lab technician 408 may perform safety testing on actual electronic control unit 206 without actual electronic control unit 206 being embedded within vehicle 401. In other words, in contrast to being embedded within vehicle 401, actual electronic control unit 206 may instead be embedded within, or connected to, emulation unit 406 within a safety laboratory 410. Vehicle 401 may not even be present within safety laboratory 410 or even within the vicinity of safety laboratory 410. Nevertheless, emulation unit 406 may generate emulated network traffic, as discussed above, such that actual electronic control unit 206 receives input that, from the perspective of actual electronic control unit 206, is effectively indistinguishable from network traffic that actual electronic control unit 206 would receive during actual or ordinary operation of vehicle 401.

At step 304, one or more of the systems described herein may manipulate input to the actual electronic control unit to test how safely the actual electronic control unit and the emulated electronic control unit respond to the manipulated input. For example, manipulation module 106 may, as part of computing device 202 in FIG. 2, manipulate input to actual electronic control unit 206 to test how safely actual electronic control unit 206 and the emulated electronic control unit respond to the manipulated input.

As used herein, the phrase "how safely the actual electronic control unit and the emulated electronic control unit respond" generally refers to testing how safely one or more of the actual electronic control unit and the emulated electronic control unit respond to the manipulation of input. More specifically, the disclosed systems and methods may check for dangerous conditions generated by output from either of the actual electronic control unit and the emulated electronic control unit. In other words, in some examples, the manipulated input may cause a collateral dangerous condition that originates from the emulated electronic control unit instead of the actual electronic control unit. For example, if the actual electronic control unit regulates the engine temperature and the emulated electronic control unit controls a braking speed, then the safety testing may trigger a dangerous braking speed (within the larger context of the overall emulation, as discussed below) even if the engine temperature remains constant at a comfortably safe range. Moreover, as used herein, the phrase "manipulate the input" generally refers to modifying an item of data for inputting to the actual electronic control unit to test how the actual electronic control unit (or another emulated electronic control unit) responds to the specific modification.

Manipulation module 106 may manipulate the input in a variety of ways. In some examples, manipulation module 106 may fuzz the input. For example, manipulation module 106 may alter the input to include random input and/or invalid input. In various examples, manipulation module 106 may manipulate one or more of (1) a data field that specifies the network address or destination for the manipulated input, (2) a data field that specifies a network address or source for the manipulated input, (3) an identification of the command that the electronic control unit is configured to execute (e.g., generating a command or converting one command to another command), (4) a parameter of the command that specifies a value or option that instructs the electronic control unit how to process the command, (5) network metadata that vehicle bus 204 uses to direct, route, and/or otherwise process the manipulated input, and/or (6) a network data section, or payload section, as distinct from network metadata, that includes data for use by the receiving electronic control unit (e.g., data that vehicle bus 204 does not use, or need, to route network traffic).

Notably, different sections of data (e.g., network metadata versus payload data, different fields within network metadata or within payload data) may be divided physically across the physical bus at the same point in time and/or be divided across time while using the same physical bus or portion of the physical bus. Parameters, values, options, commands, and/or data payload sections, may specify one or more of a temperature, a speed, acceleration, and RPM, user input through one or more vehicle input devices (e.g., the steering wheel, the brake pedal, the acceleration pedal, and/or any user input button or interface), lock/unlock, open/close, a degree of turning and/or pressing the input wheel or button, a time across which the input action was recorded, a speed of the user input, an on/off command for the entire device or a specified function, and/or any other value or command that an electronic control unit may receive.

Notably, manipulation module 106 may operate in a "black box" mode in which manipulation module 106 lacks some or all information on how a receiving electronic control unit processes a data payload. For example, manipulation module 106 may lack information other than information distinguishing between network metadata (e.g., network source and/or destination information, and/or other information for routing and processing network traffic) and a data payload (e.g., the actual data intended to be delivered to the destination). In further examples, manipulation module 106 may lack information about a number and/or length of fields or attributes expected by the receiving electronic control unit. Additionally, or alternatively, manipulation module 106 may lack information about the manufacturer specifications, tolerances, and/or permitted ranges within a particular data field and/or set of parameter options. In one or more of these examples, manipulation module 106 may generate random, pseudorandom, and/or semi-random data to thereby fuzz input to the electronic control unit.

Notably, manipulation module 106 may manipulate input that targets actual electronic control unit 206 directly and/or that targets another emulated electronic control unit (e.g., in which case actual electronic control unit 206 may act as an intermediary). Moreover, manipulation module 106 may use any information that it possesses about the manufacturer specifications, allowed commands, expected data fields, permitted parameter options, and/or allowed or specified ranges of value to generate data that accommodates, satisfies, and/or is consistent with any permutation of these. Alternatively, even when manipulation module 106 possesses one or more of these items of information about allowed or expected data, manipulation module 106 may intentionally violate one or more of the specifications or rules to test how actual electronic control unit 206 responds.

In other examples, manipulation module 106 and/or system 100 may operate in a "batch" mode that conveniently or efficiently switches the actual electronic control unit with another actual electronic control unit. In this manner, manipulation module 106 may proceed through a series of actual electronic control units within a batch. Moreover, as in the "black box" mode, manipulation module 106 may repeat some or all of the manipulated input that was used on one electronic control unit for another electronic control unit (or any number of electronic control units), including other electronic control units having different model numbers, manufacturers, functionalities, or fields of functionality (e.g., a braking electronic control unit versus a radio electronic control unit). Manipulation module 106 may especially repeat some or all of the manipulated input in the case that manipulation module 106 lacks one or more of the items of information specified above including manufacturer specifications, allowed commands, allowed parameter options, allowed ranges of values for specific data fields, etc.

At step 306, one or more of the systems described herein may detect an output from the actual electronic control unit that indicates a response, from the actual electronic control unit, to manipulating the input. For example, detection module 108 may, as part of computing device 202 in FIG. 2, detect output 210 from actual electronic control unit 206 that indicates a response, from actual electronic control unit 206, to manipulating the input.

Detection module 108 may detect the output from the actual electronic control unit in a variety of ways. In some examples, detection module 108 may detect the output as network traffic received from the actual electronic control unit (e.g., through the physical port or terminal or other network hardware device, as discussed above). In other words, detection module 108 may detect network traffic output from the actual electronic control unit to the vehicle bus or another electronic control unit, which may be emulated, as discussed above. In these examples, detection module 108 may use any item of information that it possesses, as discussed above, about a protocol, specification, and/or formatting of network traffic to, and from, the electronic control unit.

For example, detection module 108 may use information that distinguishes between network metadata and a data payload, between different fields within any of these, and/or between allowed and non-allowed values or options, as discussed above. Similarly, detection module 108 may use information that identifies a meaning, or significance, to a particular item of data or value specified within the data. For example, detection module 108 may use information that specifies that a particular field of binary numbers indicate an error message, a warning message, an on/off message (e.g., turning on or off a particular functionality and/or another vehicle component connected to vehicle bus 204), a network destination for the output (e.g., when the electronic control unit communicates with another electronic control unit), a lock/unlock message, an increase/decrease message, a particular speed, acceleration, level, instruction, command, and/or other output from the electronic control unit. In other examples, as in the "black box" mode, detection module 108 may lack one or more of these items of information and may, therefore, need to make one or more inferences, or levels of inferences, to detect the output or the meaning of the output.

In further examples, detection module 108 may detect a change in a physical state of the actual electronic control unit. For example, detection module 108 may include one or more sensors that may detect a change in sound, visuals, temperature, vibration, frequency, scent, and/or motion associated with, or originating from, the actual electronic control unit. In one specific example, detection module 108 may detect an actuator turning on or off. In other examples, detection module 108 may detect that a particular electrical line has gone live with power or, alternatively, gone dead with no power. In some examples, detection module 108 may detect a baseline level of normal variation or output along any of these physical dimensions. Similarly, detection module 108 may also detect any statistically significant change, or deviation from the baseline level, and the output along any one or more of these physical dimensions. For example, detection module 108 may detect that, although the actual electronic control unit naturally varies along a particular spectrum of sound and/or temperature, the actual electronic control unit deviated significantly in response to receiving the manipulated input.

At step 308, one or more of the systems described herein may evaluate a safety level of at least one of the actual electronic control unit and the emulated electronic control unit based on detecting the output from the actual electronic control unit. For example, evaluation module 110 may, as part of computing device 202 in FIG. 2, evaluate a safety level of at least one of actual electronic control unit 206 and emulated electronic control unit 208 based on detecting output 210 from actual electronic control unit 206. As used herein, the term "safety level" generally refers to any safety value, estimation, and/or degree that measures how safely the actual electronic control unit and/or the emulated electronic control unit respond to the manipulation of input.

Evaluation module 110 may evaluate the safety level of the actual electronic control unit and/or the emulated electronic control unit in a variety of ways. For example, evaluation module 110 may determine that the manipulated input caused at least one of the actual electronic control unit and the emulated control unit to create an emulation of a dangerous physical condition within the vehicle, as discussed further below. Notably, evaluation module 110 may process, or evaluate, any of the detected outputs, statistical deviations, and/or abnormal responses discussed above regarding detection module 108. In these examples, evaluation module 110 may use any formula, algorithm, and/or threshold value, for determining whether the detected outputs constitute a dangerous condition or other notable event. For example, evaluation module 110 may monitor for, and evaluate, failure of the electronic control unit, a warning from the electronic control unit, performance outside of specifications along any dimension for the electronic control unit, deviation outside of a tolerable range, including ranges of temperature, sound, frequency, motion, and/or vibration, etc., as discussed above.

In some examples, evaluation module 110 may evaluate the safety level by evaluating a safety level of the emulated electronic control unit based on detecting the output from the actual electronic control unit. In other words, evaluation module 110 may monitor for, and detect, any unexpected, undesired, abnormal, and/or unsafe network traffic originating from the emulated electronic control unit in response to the manipulation of the input.

Figure 5:
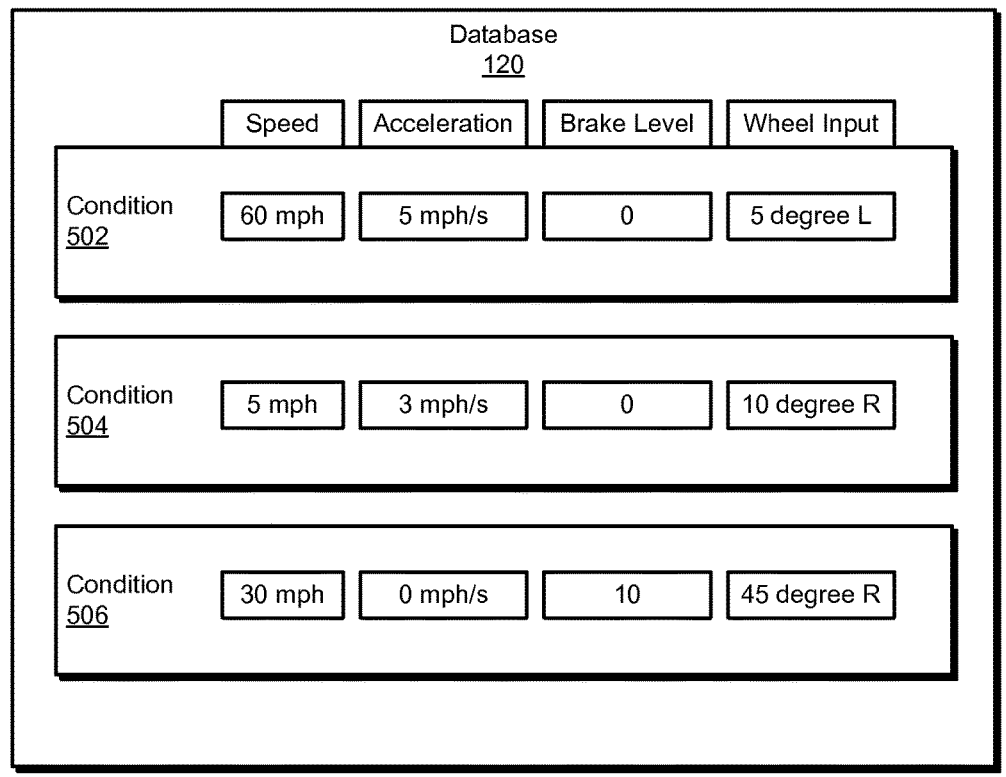
FIG. 5 is a block diagram of an exemplary database including testing conditions for evaluating electronic control units within vehicle emulations.

Notably, evaluation module 110 may evaluate the safety level at least in part by monitoring for, and detecting, unsafe or dangerous conditions that originate from the actual electronic control unit, and/or one or more emulated electronic control units, even when each of the electronic control units performs normally according to manufacturer or design specifications. With respect to these examples, FIG. 5 shows an example of database 120 that includes data specifying a condition 502, a condition 504, and a condition 506. Each of these conditions may be associated with a permutation of one or more values, such as a speed, acceleration, brake level, and/or wheel input, as further shown in FIG. 5.

In the example of FIG. 5, one or more of the conditions may be safe and/or unsafe, all of the conditions may be stored within a single database 120, and all of the conditions specify values for the same attributes (i.e., speed, acceleration, brake level, and wheel input). Nevertheless, in other examples, one or more of the conditions may not be stored within a single database, one or more of the conditions may specify values for other attributes that differ from attributes identified in other conditions, and/or all of the conditions may be dangerous. Moreover, although FIG. 5 does not specify a period or amount of time associated with one or more of the values within each condition, database 120 may also include values that specify the period or amount of time (e.g., 60 miles an hour over a two-minute period of time and a five degrees turn left of the steering wheel over a 20 second period of time).

In the example of FIG. 5, condition 502 and condition 504 may be relatively safe. For example, in condition 502, the vehicle may be traveling at 60 miles an hour while turning the wheel five degrees over an unspecified period of time. Similarly, in condition 504, the wheel may be turning ten degrees to the right while the vehicle is moving slowly at five miles an hour. Nevertheless, condition 506 may specify an unsafe or dangerous condition in which the wheel is turning 45 degrees to the right over a dangerously short period of time (e.g., one second) while the vehicle is moving relatively fast at 30 miles an hour. Condition 506 may also be dangerous because the brake level may be at a level of ten on a ten point scale (where ten is the highest value of braking).

Notably, one or more of the specified values in FIG. 5 may correspond to values that the emulation unit triggered by inputting the manipulated input. Moreover, one or more other values may correspond to values that the electronic control unit, and/or one or more emulated electronic control units, generated in response to the manipulated input. For example, system 100 may manipulate input to create a speed of 30 miles an hour and then detect that this results in a brake level of 10.

Of course, the example of FIG. 5 is merely exemplary. Each of the conditions may specify higher-level values, such as the value shown in FIG. 5, such as speed and acceleration. Alternatively, one or more of the conditions may specify lower-level values, such as an amp level, an electrical signal frequency, an input/output network command, etc. Moreover, evaluation module 110 and/or a lab technician or security vendor may specify any arbitrary number of conditions, including any arbitrary number or permutation of attributes and specified values, to test the safety of the electronic control unit.

Notably, although condition 506 is dangerous, each of the values, such as speed and acceleration (which may each be associated with one or more corresponding electronic control units), may not indicate a dangerous condition when considered in isolation. For example, the speed of 30 mph, and the associated network traffic and electronic control unit responses that generate and manage that speed, are not unsafe by definition, but only become unsafe within the larger context of a larger emulation, which may include emulations of other electronic control units, as discussed above. Accordingly, the disclosed systems and methods may detect unsafe or dangerous conditions that arise from the combination of various electronic control units, including emulated electronic control units, even when the performance of a particular electronic control unit in isolation is not dangerous and otherwise conforms with manufacturer or safety specifications. Moreover, in some examples, evaluation module 110 may also take remedial action in response to detecting a dangerous condition, such as notifying a user or safety application, sounding an alert or warning, and/or storing an indication of the detection within a database, storage, and/or public record, or other report. Evaluation module 110 may also modify the actual electronic control unit in a manner that eliminates the danger associated with the dangerous condition.

As explained above in connection with method 300 in FIG. 3, the disclosed systems and methods may enable a testing facility to evaluate the safety of an electronic control unit without embedding the electronic control unit within an operating vehicle. Similarly, the disclosed systems and methods may enable the testing facility to evaluate the safety of the electronic control unit within an emulated environment in which the electronic control unit coordinates with, and responds to, network traffic from other emulated electronic control units. In general, these emulation testing techniques can identify safety threats, and other dangerous conditions, even when all or some of the electronic control units (including the actual electronic control unit) satisfy manufacturer specifications by performing specified functions in response to corresponding commands.

Figure 6:
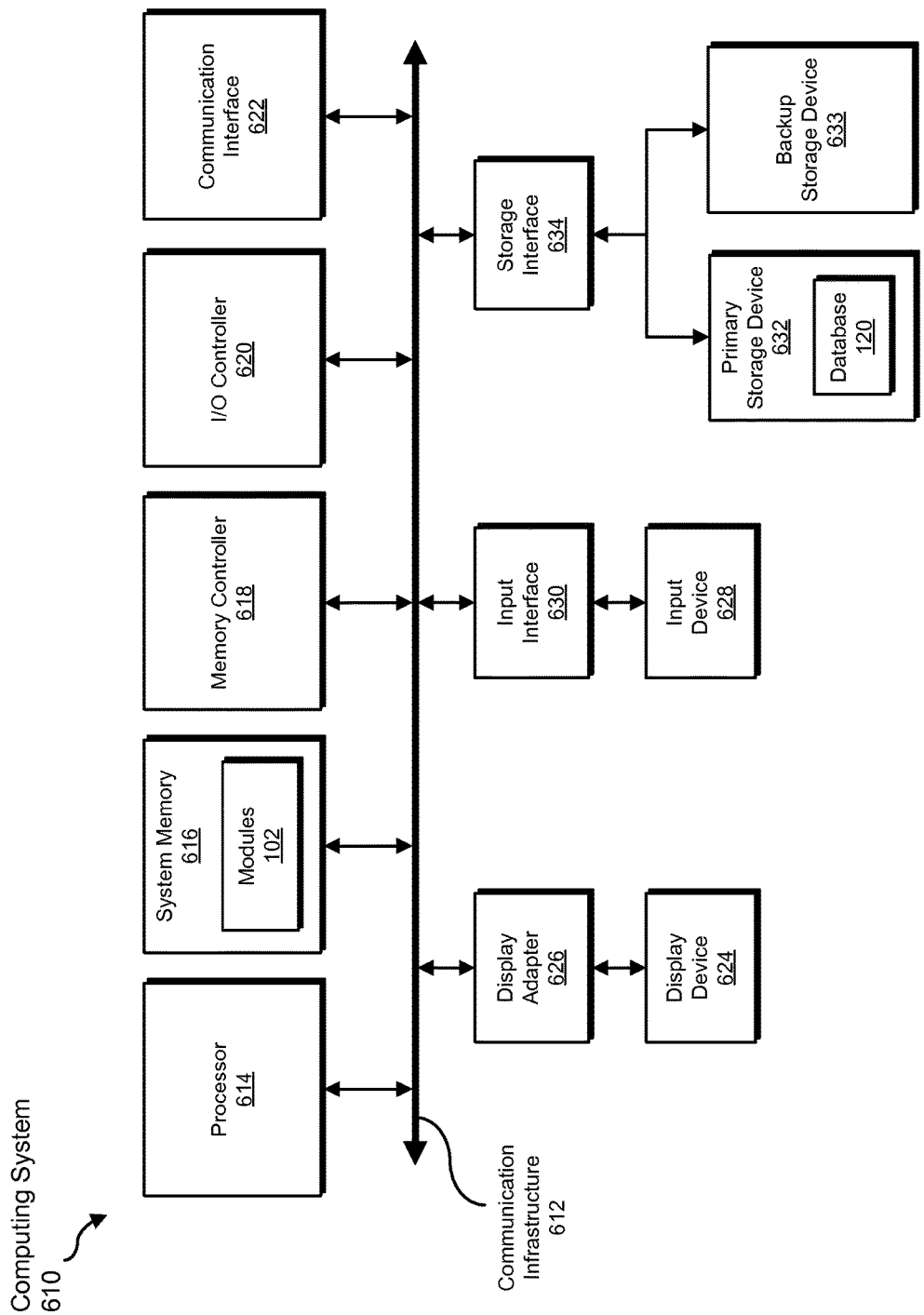
FIG. 6 is a block diagram of an exemplary computing system capable of implementing one or more of the embodiments described and/or illustrated herein.

FIG. 6 is a block diagram of an exemplary computing system 610 capable of implementing one or more of the embodiments described and/or illustrated herein. For example, all or a portion of computing system 610 may perform and/or be a means for performing, either alone or in combination with other elements, one or more of the steps described herein (such as one or more of the steps illustrated in FIG. 3). All or a portion of computing system 610 may also perform and/or be a means for performing any other steps, methods, or processes described and/or illustrated herein.

Computing system 610 broadly represents any single or multi-processor computing device or system capable of executing computer-readable instructions. Examples of computing system 610 include, without limitation, workstations, laptops, client-side terminals, servers, distributed computing systems, handheld devices, or any other computing system or device. In its most basic configuration, computing system 610 may include at least one processor 614 and a system memory 616.

Processor 614 generally represents any type or form of physical processing unit (e.g., a hardware-implemented central processing unit) capable of processing data or interpreting and executing instructions. In certain embodiments, processor 614 may receive instructions from a software application or module. These instructions may cause processor 614 to perform the functions of one or more of the exemplary embodiments described and/or illustrated herein.

System memory 616 generally represents any type or form of volatile or non-volatile storage device or medium capable of storing data and/or other computer-readable instructions. Examples of system memory 616 include, without limitation, Random Access Memory (RAM), Read Only Memory (ROM), flash memory, or any other suitable memory device. Although not required, in certain embodiments computing system 610 may include both a volatile memory unit (such as, for example, system memory 616) and a non-volatile storage device (such as, for example, primary storage device 632, as described in detail below). In one example, one or more of modules 102 from FIG. 1 may be loaded into system memory 616.

In certain embodiments, exemplary computing system 610 may also include one or more components or elements in addition to processor 614 and system memory 616. For example, as illustrated in FIG. 6, computing system 610 may include a memory controller 618, an Input/Output (I/O) controller 620, and a communication interface 622, each of which may be interconnected via a communication infrastructure 612. Communication infrastructure 612 generally represents any type or form of infrastructure capable of facilitating communication between one or more components of a computing device. Examples of communication infrastructure 612 include, without limitation, a communication bus (such as an Industry Standard Architecture (ISA), Peripheral Component Interconnect (PCI), PCI Express (PCIe), or similar bus) and a network.

Memory controller 618 generally represents any type or form of device capable of handling memory or data or controlling communication between one or more components of computing system 610. For example, in certain embodiments memory controller 618 may control communication between processor 614, system memory 616, and I/O controller 620 via communication infrastructure 612.

I/O controller 620 generally represents any type or form of module capable of coordinating and/or controlling the input and output functions of a computing device. For example, in certain embodiments I/O controller 620 may control or facilitate transfer of data between one or more elements of computing system 610, such as processor 614, system memory 616, communication interface 622, display adapter 626, input interface 630, and storage interface 634.

Communication interface 622 broadly represents any type or form of communication device or adapter capable of facilitating communication between exemplary computing system 610 and one or more additional devices. For example, in certain embodiments communication interface 622 may facilitate communication between computing system 610 and a private or public network including additional computing systems. Examples of communication interface 622 include, without limitation, a wired network interface (such as a network interface card), a wireless network interface (such as a wireless network interface card), a modem, and any other suitable interface. In at least one embodiment, communication interface 622 may provide a direct connection to a remote server via a direct link to a network, such as the Internet. Communication interface 622 may also indirectly provide such a connection through, for example, a local area network (such as an Ethernet network), a personal area network, a telephone or cable network, a cellular telephone connection, a satellite data connection, or any other suitable connection.

In certain embodiments, communication interface 622 may also represent a host adapter configured to facilitate communication between computing system 610 and one or more additional network or storage devices via an external bus or communications channel. Examples of host adapters include, without limitation, Small Computer System Interface (SCSI) host adapters, Universal Serial Bus (USB) host adapters, Institute of Electrical and Electronics Engineers (IEEE) 1394 host adapters, Advanced Technology Attachment (ATA), Parallel ATA (PATA), Serial ATA (SATA), and External SATA (eSATA) host adapters, Fibre Channel interface adapters, Ethernet adapters, or the like. Communication interface 622 may also allow computing system 610 to engage in distributed or remote computing. For example, communication interface 622 may receive instructions from a remote device or send instructions to a remote device for execution.

As illustrated in FIG. 6, computing system 610 may also include at least one display device 624 coupled to communication infrastructure 612 via a display adapter 626. Display device 624 generally represents any type or form of device capable of visually displaying information forwarded by display adapter 626. Similarly, display adapter 626 generally represents any type or form of device configured to forward graphics, text, and other data from communication infrastructure 612 (or from a frame buffer, as known in the art) for display on display device 624.

As illustrated in FIG. 6, exemplary computing system 610 may also include at least one input device 628 coupled to communication infrastructure 612 via an input interface 630. Input device 628 generally represents any type or form of input device capable of providing input, either computer or human generated, to exemplary computing system 610. Examples of input device 628 include, without limitation, a keyboard, a pointing device, a speech recognition device, or any other input device.

As illustrated in FIG. 6, exemplary computing system 610 may also include a primary storage device 632 and a backup storage device 633 coupled to communication infrastructure 612 via a storage interface 634. Storage devices 632 and 633 generally represent any type or form of storage device or medium capable of storing data and/or other computer-readable instructions. For example, storage devices 632 and 633 may be a magnetic disk drive (e.g., a so-called hard drive), a solid state drive, a floppy disk drive, a magnetic tape drive, an optical disk drive, a flash drive, or the like. Storage interface 634 generally represents any type or form of interface or device for transferring data between storage devices 632 and 633 and other components of computing system 610. In one example, database 120 from FIG. 1 may be stored in primary storage device 632.

In certain embodiments, storage devices 632 and 633 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 632 and 633 may also include other similar structures or devices for allowing computer software, data, or other computer-readable instructions to be loaded into computing system 610. For example, storage devices 632 and 633 may be configured to read and write software, data, or other computer-readable information. Storage devices 632 and 633 may also be a part of computing system 610 or may be a separate device accessed through other interface systems.

Many other devices or subsystems may be connected to computing system 610. Conversely, all of the components and devices illustrated in FIG. 6 need not be present to practice the embodiments described and/or illustrated herein. The devices and subsystems referenced above may also be interconnected in different ways from that shown in FIG. 6. Computing system 610 may also employ any number of software, firmware, and/or hardware configurations. For example, one or more of the exemplary embodiments disclosed herein may be encoded as a computer program (also referred to as computer software, software applications, computer-readable instructions, or computer control logic) on a computer-readable medium. The phrase "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The computer-readable medium containing the computer program may be loaded into computing system 610. All or a portion of the computer program stored on the computer-readable medium may then be stored in system memory 616 and/or various portions of storage devices 632 and 633. When executed by processor 614, a computer program loaded into computing system 610 may cause processor 614 to perform and/or be a means for performing the functions of one or more of the exemplary embodiments described and/or illustrated herein. Additionally or alternatively, one or more of the exemplary embodiments described and/or illustrated herein may be implemented in firmware and/or hardware. For example, computing system 610 may be configured as an Application Specific Integrated Circuit (ASIC) adapted to implement one or more of the exemplary embodiments disclosed herein.

Figure 7:
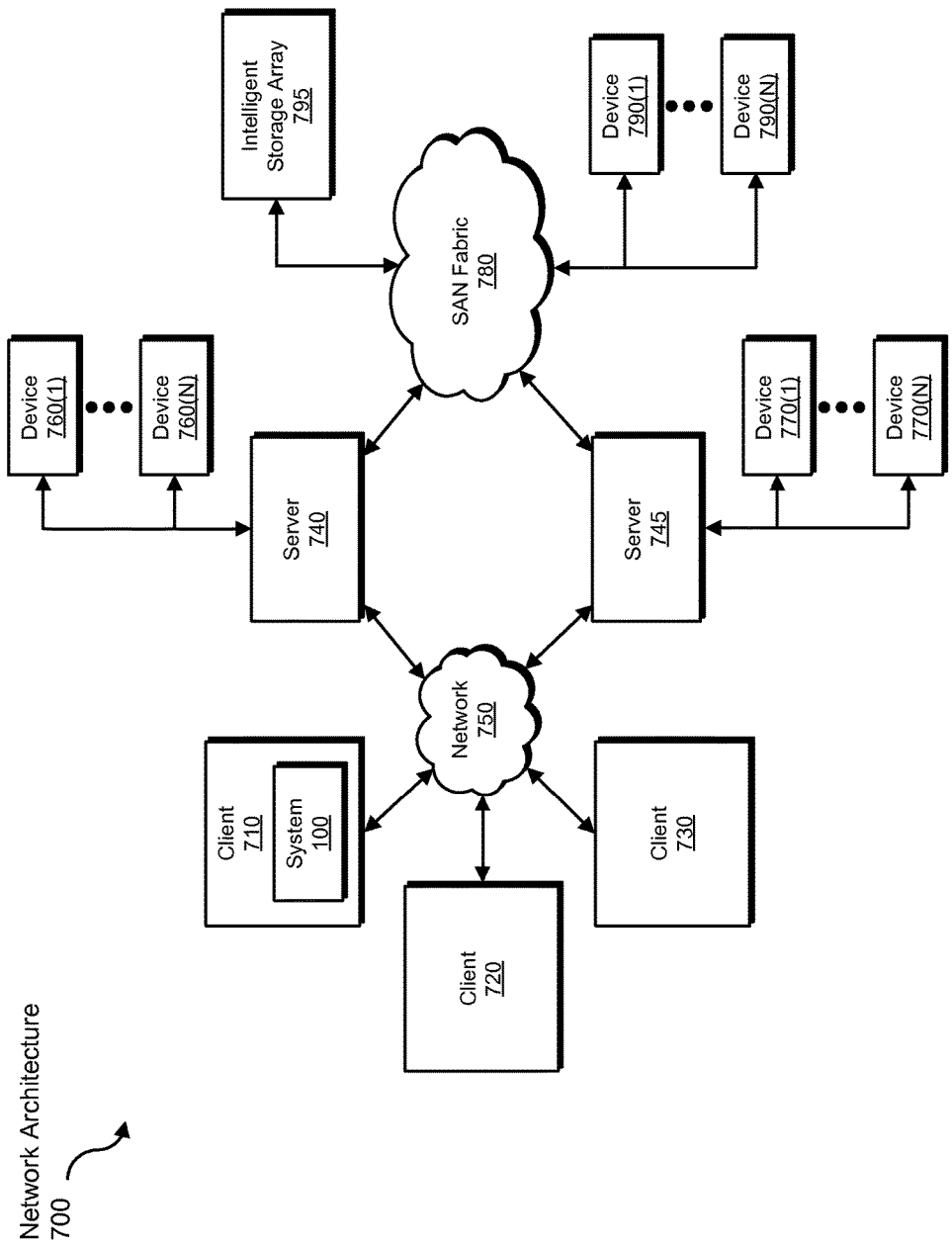
FIG. 7 is a block diagram of an exemplary computing network capable of implementing one or more of the embodiments described and/or illustrated herein.

FIG. 7 is a block diagram of an exemplary network architecture 700 in which client systems 710, 720, and 730 and servers 740 and 745 may be coupled to a network 750. As detailed above, all or a portion of network architecture 700 may perform and/or be a means for performing, either alone or in combination with other elements, one or more of the steps disclosed herein (such as one or more of the steps illustrated in FIG. 3). All or a portion of network architecture 700 may also be used to perform and/or be a means for performing other steps and features set forth in the instant disclosure.

Client systems 710, 720, and 730 generally represent any type or form of computing device or system, such as exemplary computing system 610 in FIG. 6. Similarly, servers 740 and 745 generally represent computing devices or systems, such as application servers or database servers, configured to provide various database services and/or run certain software applications. Network 750 generally represents any telecommunication or computer network including, for example, an intranet, a WAN, a LAN, a PAN, or the Internet. In one example, client systems 710, 720, and/or 730 and/or servers 740 and/or 745 may include all or a portion of system 100 from FIG. 1.

As illustrated in FIG. 7, one or more storage devices 760(1)-(N) may be directly attached to server 740. Similarly, one or more storage devices 770(1)-(N) may be directly attached to server 745. Storage devices 760(1)-(N) and storage devices 770(1)-(N) generally represent any type or form of storage device or medium capable of storing data and/or other computer-readable instructions. In certain embodiments, storage devices 760(1)-(N) and storage devices 770(1)-(N) may represent Network-Attached Storage (NAS) devices configured to communicate with servers 740 and 745 using various protocols, such as Network File System (NFS), Server Message Block (SMB), or Common Internet File System (CIFS).

Servers 740 and 745 may also be connected to a Storage Area Network (SAN) fabric 780. SAN fabric 780 generally represents any type or form of computer network or architecture capable of facilitating communication between a plurality of storage devices. SAN fabric 780 may facilitate communication between servers 740 and 745 and a plurality of storage devices 790(1)-(N) and/or an intelligent storage array 795. SAN fabric 780 may also facilitate, via network 750 and servers 740 and 745, communication between client systems 710, 720, and 730 and storage devices 790(1)-(N) and/or intelligent storage array 795 in such a manner that devices 790(1)-(N) and array 795 appear as locally attached devices to client systems 710, 720, and 730. As with storage devices 760(1)-(N) and storage devices 770(1)-(N), storage devices 790(1)-(N) and intelligent storage array 795 generally represent any type or form of storage device or medium capable of storing data and/or other computer-readable instructions.

In certain embodiments, and with reference to exemplary computing system 610 of FIG. 6, a communication interface, such as communication interface 622 in FIG. 6, may be used to provide connectivity between each client system 710, 720, and 730 and network 750. Client systems 710, 720, and 730 may be able to access information on server 740 or 745 using, for example, a web browser or other client software. Such software may allow client systems 710, 720, and 730 to access data hosted by server 740, server 745, storage devices 760(1)-(N), storage devices 770(1)-(N), storage devices 790(1)-(N), or intelligent storage array 795. Although FIG. 7 depicts the use of a network (such as the Internet) for exchanging data, the embodiments described and/or illustrated herein are not limited to the Internet or any particular network-based environment.

In at least one embodiment, all or a portion of one or more of the exemplary embodiments disclosed herein may be encoded as a computer program and loaded onto and executed by server 740, server 745, storage devices 760(1)-(N), storage devices 770(1)-(N), storage devices 790(1)-(N), intelligent storage array 795, or any combination thereof. All or a portion of one or more of the exemplary embodiments disclosed herein may also be encoded as a computer program, stored in server 740, run by server 745, and distributed to client systems 710, 720, and 730 over network 750.

As detailed above, computing system 610 and/or one or more components of network architecture 700 may perform and/or be a means for performing, either alone or in combination with other elements, one or more steps of an exemplary method for evaluating electronic control units within vehicle emulations.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of exemplary system 100 in FIG. 1 may represent portions of a cloud-computing or network-based environment. Cloud-computing environments may provide various services and applications via the Internet. These cloud-based services (e.g., software as a service, platform as a service, infrastructure as a service, etc.) may be accessible through a web browser or other remote interface. Various functions described herein may be provided through a remote desktop environment or any other cloud-based computing environment.

In various embodiments, all or a portion of exemplary system 100 in FIG. 1 may facilitate multi-tenancy within a cloud-based computing environment. In other words, the software modules described herein may configure a computing system (e.g., a server) to facilitate multi-tenancy for one or more of the functions described herein. For example, one or more of the software modules described herein may program a server to enable two or more clients (e.g., customers) to share an application that is running on the server. A server programmed in this manner may share an application, operating system, processing system, and/or storage system among multiple customers (i.e., tenants).

One or more of the modules described herein may also partition data and/or configuration information of a multi-tenant application for each customer such that one customer cannot access data and/or configuration information of another customer.

According to various embodiments, all or a portion of exemplary system 100 in FIG. 1 may be implemented within a virtual environment. For example, the modules and/or data described herein may reside and/or execute within a virtual machine. As used herein, the phrase "virtual machine" generally refers to any operating system environment that is abstracted from computing hardware by a virtual machine manager (e.g., a hypervisor). Additionally or alternatively, the modules and/or data described herein may reside and/or execute within a virtualization layer. As used herein, the phrase "virtualization layer" generally refers to any data layer and/or application layer that overlays and/or is abstracted from an operating system environment. A virtualization layer may be managed by a software virtualization solution (e.g., a file system filter) that presents the virtualization layer as though it were part of an underlying base operating system. For example, a software virtualization solution may redirect calls that are initially directed to locations within a base file system and/or registry to locations within a virtualization layer.

In some examples, all or a portion of exemplary system 100 in FIG. 1 may represent portions of a mobile computing environment. Mobile computing environments may be implemented by a wide range of mobile computing devices, including mobile phones, tablet computers, e-book readers, personal digital assistants, wearable computing devices (e.g., computing devices with a head-mounted display, smartwatches, etc.), and the like. In some examples, mobile computing environments may have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein may be provided for a mobile computing environment and/or may interact with a mobile computing environment.

In addition, all or a portion of exemplary system 100 in FIG. 1 may represent portions of, interact with, consume data produced by, and/or produce data consumed by one or more systems for information management. As used herein, the phrase "information management" may refer to the protection, organization, and/or storage of data. Examples of systems for information management may include, without limitation, storage systems, backup systems, archival systems, replication systems, high availability systems, data search systems, virtualization systems, and the like.

In some embodiments, all or a portion of exemplary system 100 in FIG. 1 may represent portions of, produce data protected by, and/or communicate with one or more systems for information security. As used herein, the phrase "information security" may refer to the control of access to protected data. Examples of systems for information security may include, without limitation, systems providing managed security services, data loss prevention systems, identity authentication systems, access control systems, encryption systems, policy compliance systems, intrusion detection and prevention systems, electronic discovery systems, and the like.

According to some examples, all or a portion of exemplary system 100 in FIG. 1 may represent portions of, communicate with, and/or receive protection from one or more systems for endpoint security. As used herein, the phrase "endpoint security" may refer to the protection of endpoint systems from unauthorized and/or illegitimate use, access, and/or control. Examples of systems for endpoint protection may include, without limitation, anti-malware systems, user authentication systems, encryption systems, privacy systems, spam-filtering services, and the like.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

While various embodiments have been described and/or illustrated herein in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may configure a computing system to perform one or more of the exemplary embodiments disclosed herein.

In addition, one or more of the modules described herein may transform data, physical devices, and/or representations of physical devices from one form to another. For example, one or more of the modules recited herein may receive recorded network traffic to be transformed, transform the recorded network traffic by manipulating the network traffic for the purposes of a safety test, output a result of the transformation to a memory, storage, and/or vehicle bus, use the result of the transformation to safety test an electronic control unit, and store the result of the transformation to a memory or storage, as discussed above. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computer-implemented method for evaluating electronic control units within vehicle emulations, at least a portion of the method being performed by a computing device comprising at least one processor, the method comprising:
   connecting an actual electronic control unit for a vehicle to a vehicle bus that emulates network traffic rather than actual network traffic generated by operation of the vehicle, the emulated network traffic including network traffic from an emulation of another electronic control unit;
   manipulating input to the actual electronic control unit to test how the actual electronic control unit and the emulated electronic control unit respond to the manipulated input, wherein the input triggers an emulation of an unsafe or dangerous condition defined by values for two or more vehicle attributes;
   detecting an output from the actual electronic control unit that indicates a response, from the actual electronic control unit, to manipulating the input;
   determining that the manipulated input causes at least one of the actual electronic control unit and the emulated electronic control unit to create the emulation of the unsafe or dangerous condition within the vehicle, based on the output from the actual electronic control unit.

2. The computer-implemented method of claim 1, wherein the unsafe or dangerous condition is previously determined to be unsafe or dangerous.

3. The computer-implemented method of claim 2, wherein the unsafe or dangerous condition is thusly defined in a database.

4. The computer-implemented method of claim 1, wherein when considered in isolation, each of the values for the two or more vehicle attributes does not correspond with an unsafe or dangerous condition.

5. The computer-implemented method of claim 1, wherein the two or more vehicle attributes comprise two or more of: speed, acceleration, brake level, wheel input, amp level, electrical signal frequency, input/output network command, temperature, sound, frequency, motion, and vibration.

6. The computer-implemented method of claim 1, wherein the steps of manipulating the input and detecting the output are continuously performed and the method further comprises monitoring the output from the actual electronic control unit, the step of monitoring being performed before the step of determining.

7. The computer-implemented method of claim 1, wherein the vehicle bus corresponds to at least one of:
   the FLEXRAY protocol;
   the CONTROLLER AREA NETWORK protocol; and
   the MEDIA ORIENTED SYSTEMS TRANSPORT protocol.

8. The computer-implemented method of claim 1, wherein detecting the output from the actual electronic control unit comprises at least one of:
   detecting network traffic output from the actual electronic control unit to the vehicle bus; and
   detecting a change in a physical state of the actual electronic control unit.

9. The computer-implemented method of claim 1, wherein the step of determining comprises determining that the manipulated input causes the emulated electronic control unit to create the emulation of the unsafe or dangerous condition within the vehicle, based on the output from the actual electronic control unit.

10. A system for evaluating electronic control units within vehicle emulations, the system comprising:
    a connection module, stored in memory, that connects an actual electronic control unit for a vehicle to a vehicle bus that emulates network traffic rather than actual network traffic generated by operation of the vehicle, the emulated network traffic including network traffic from an emulation of another electronic control unit;
    a manipulation module, stored in memory, that manipulates input to the actual electronic control unit to test how the actual electronic control unit and the emulated electronic control unit respond to the manipulated input, wherein the input triggers an emulation of an unsafe or dangerous condition defined by values for two or more vehicle attributes;
    a detection module, stored in memory, that detects an output from the actual electronic control unit that indicates a response, from the actual electronic control unit, to manipulating the input;
    an evaluation module, stored in memory, that determines that the manipulated input causes at least one of the actual electronic control unit and the emulated electronic control unit to create the emulation of the unsafe or dangerous condition within the vehicle, based on the output from the actual electronic control unit; and
    at least one physical processor configured to execute the connection module, the manipulation module, the detection module, and the evaluation module.

11. The system of claim 10, wherein the connection module records actual network traffic generated by operation of the vehicle.

12. The system of claim 11, wherein the vehicle bus emulates network traffic by replaying the recorded actual network traffic.

13. The system of claim 10, wherein the connection module connects the actual electronic control unit for the vehicle to the vehicle bus without the actual electronic control unit being integrated within the vehicle.

14. The system of claim 10, wherein the manipulation module manipulates input to the actual electronic control unit by fuzzing the input by altering the input to include at least one of random input and invalid input.

15. The system of claim 10, wherein the emulated network traffic includes network traffic from a plurality of emulations of other electronic control units.

16. The system of claim 10, wherein the vehicle bus corresponds to at least one of:
    the FLEXRAY protocol;
    the CONTROLLER AREA NETWORK protocol; and
    the MEDIA ORIENTED SYSTEMS TRANSPORT protocol.

17. The system of claim 10, wherein the detection module detects the output from the actual electronic control unit by at least one of:
    detecting network traffic output from the actual electronic control unit to the vehicle bus; and
    detecting a change in a physical state of the actual electronic control unit.

18. The system of claim 10, wherein the evaluation module determines that the manipulated input causes the emulated electronic control unit to create the emulation of the unsafe or dangerous condition within the vehicle, based on the output from the actual electronic control unit.

19. A non-transitory computer-readable medium comprising one or more computer-executable instructions that, when executed by at least one processor of a computing device, cause the computing device to:

connect an actual electronic control unit for a vehicle to a vehicle bus that emulates network traffic rather than actual network traffic generated by operation of the vehicle, the emulated network traffic including network traffic from an emulation of another electronic control unit;

manipulate input to the actual electronic control unit to test how the actual electronic control unit and the emulated electronic control unit respond to the manipulated input, wherein the input triggers an emulation of an unsafe or dangerous condition defined by values for two or more vehicle attributes;

detect an output from the actual electronic control unit that indicates a response, from the actual electronic control unit, to manipulating the input; and determining that the manipulated input caused at least one of the actual electronic control unit and the emulated electronic control unit to create the emulation of the unsafe or dangerous condition within the vehicle, based on the output from the actual electronic control unit.

* * * * *